United States Patent
Le et al.

(10) Patent No.: US 11,626,519 B2
(45) Date of Patent: *Apr. 11, 2023

(54) FABRICATION OF NON-PLANAR IGZO DEVICES FOR IMPROVED ELECTROSTATICS

(71) Applicant: Intel Corporation, Santa Clara, CA (US)

(72) Inventors: Van H. Le, Beaverton, OR (US); Gilbert Dewey, Beaverton, OR (US); Rafael Rios, Austin, TX (US); Jack T. Kavalieros, Portland, OR (US); Marko Radosavljevic, Portland, OR (US); Kent E. Millard, Hillsboro, OR (US); Marc C. French, Forest Grove, OR (US); Ashish Agrawal, Hillsboro, OR (US); Benjamin Chu-Kung, Portland, OR (US); Ryan E. Arch, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/074,251

(22) Filed: Oct. 19, 2020

(65) Prior Publication Data

US 2021/0050455 A1 Feb. 18, 2021

Related U.S. Application Data

(63) Continuation of application No. 15/777,117, filed as application No. PCT/US2015/000319 on Dec. 23, 2015, now Pat. No. 10,847,656.

(51) Int. Cl.
*H01L 29/786* (2006.01)
*H01L 29/423* (2006.01)
(Continued)

(52) U.S. Cl.
CPC .. *H01L 29/78693* (2013.01); *H01L 21/02565* (2013.01); *H01L 21/02592* (2013.01);
(Continued)

(58) Field of Classification Search
CPC ........... H01L 29/78693; H01L 29/7869; H01L 29/247; H01L 21/02603; H01L 21/02592; H01L 21/02565
See application file for complete search history.

(56) References Cited

U.S. PATENT DOCUMENTS

2007/0108446 A1 5/2007 Akimoto
2008/0230853 A1 9/2008 Jang
(Continued)

FOREIGN PATENT DOCUMENTS

JP 2013254942 A 12/2013

OTHER PUBLICATIONS

Office Action from Taiwan Patent Application No. 105138464, dated Jun. 5, 2020, 6 pgs.
(Continued)

*Primary Examiner* — Julia Slutsker
(74) *Attorney, Agent, or Firm* — Schwabe, Williamson & Wyatt, P.C.

(57) ABSTRACT

Embodiments of the invention include non-planar InGaZnO (IGZO) transistors and methods of forming such devices. In an embodiment, the IGZO transistor may include a substrate and source and drain regions formed over the substrate. According to an embodiment, an IGZO layer may be formed above the substrate and may be electrically coupled to the source region and the drain region. Further embodiments include a gate electrode that is separated from the IGZO layer by a gate dielectric. In an embodiment, the gate dielectric contacts more than one surface of the IGZO layer. In one embodiment, the IGZO transistor is a finfet transistor.

(Continued)

In another embodiment the IGZO transistor is a nanowire or a nanoribbon transistor. Embodiments of the invention may also include a non-planar IGZO transistor that is formed in the back end of line stack (BEOL) of an integrated circuit chip.

11 Claims, 17 Drawing Sheets

(51) Int. Cl.
    | | |
    |---|---|
    | *H01L 29/06* | (2006.01) |
    | *H01L 29/66* | (2006.01) |
    | *H01L 21/02* | (2006.01) |
    | *H01L 29/24* | (2006.01) |
    | *H01L 29/40* | (2006.01) |
    | *H01L 29/49* | (2006.01) |
    | *H01L 29/775* | (2006.01) |

(52) U.S. Cl.
    CPC .... *H01L 21/02603* (2013.01); *H01L 29/0673* (2013.01); *H01L 29/247* (2013.01); *H01L 29/401* (2013.01); *H01L 29/42392* (2013.01); *H01L 29/4908* (2013.01); *H01L 29/66545* (2013.01); *H01L 29/66969* (2013.01); *H01L 29/7869* (2013.01); *H01L 29/78696* (2013.01); *H01L 29/775* (2013.01)

(56) References Cited

U.S. PATENT DOCUMENTS

| | | |
|---|---|---|
| 2013/0009144 A1 | 1/2013 | Cheng et al. |
| 2013/0341704 A1 | 12/2013 | Rachmady |
| 2014/0001441 A1* | 1/2014 | Kim .................. H01L 21/31155 257/29 |
| 2014/0225105 A1* | 8/2014 | Tanaka ................ H01L 29/7869 257/43 |
| 2014/0332800 A1* | 11/2014 | Hanaoka ........... H01L 29/41733 257/43 |
| 2015/0069379 A1 | 3/2015 | Wang et al. |
| 2015/0076496 A1 | 3/2015 | Tanaka |
| 2015/0214377 A1 | 7/2015 | Ito |
| 2015/0332964 A1 | 11/2015 | Cheng |
| 2016/0064531 A1* | 3/2016 | Xiao .................... H01L 29/0669 438/157 |
| 2017/0263706 A1 | 9/2017 | Gardner |

OTHER PUBLICATIONS

International Preliminary Report on Patentability for International Patent Application No. PCT/US2015/000319, dated Jul. 5, 2018, 10 pages.
International Search Report and Written Opinion for International Patent Application No. PCT/US2015/000319 dated Sep. 22, 2016, 13 pgs.
Office Action from Chinese Patent Application No. 201580085507. 4, dated Nov. 28, 2022, 10 pgs.

* cited by examiner

FABRICATION OF NON-PLANAR IGZO DEVICES FOR IMPROVED ELECTROSTATICS

CROSS-REFERENCE TO RELATED APPLICATION

This patent application is a continuation of U.S. patent application Ser. No. 15/777,117, filed May 17, 2018, which is a U.S. National Phase Application under 35 U.S.C. § 371 of International Application No. PCT/US2015/000319, filed Dec. 23, 2015, entitled "FABRICATION OF NON-PLANAR IGZO DEVICES FOR IMPROVED ELECTROSTATICS," which designates the United States of America, the entire disclosure of which are hereby incorporated by reference in their entirety and for all purposes.

FIELD OF THE INVENTION

Embodiments of the invention are in the field of semiconductor devices and processing and, in particular, semiconductor devices that include a non-planar indium-gallium-zinc-oxide (IGZO) transistors, and methods of forming such devices.

BACKGROUND OF THE INVENTION

Recently, there has been an increased use of amorphous InGaZnO (a-IGZO) semiconductors for transistor applications. The increase in use has been driven by several desirable electrical and manufacturing properties of such devices. For example, a-IGZO transistors are typically characterized by high band gaps, higher mobility than amorphous silicon, low-temperature process compatibility, and low fabrication cost. Currently, the dominant use of transistors that include a-IGZO semiconductors is in light emitting diode (LED) and organic LED (OLED) applications. The a-IGZO transistors are typically used in an active matrix display in order to control the pixels of the display. In order to meet the electrical performance specifications needed in the active matrix displays, a-IGZO transistors are fabricated as large planar transistors with large gate lengths.

DETAILED DESCRIPTION OF THE INVENTION

Figure 1A:
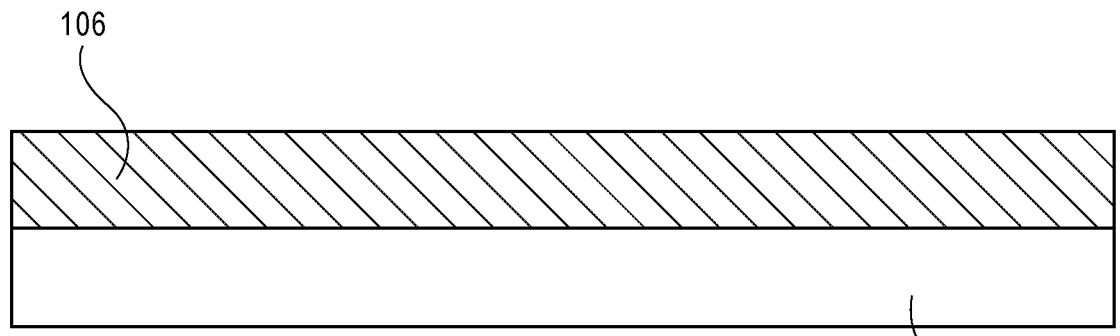
FIG. 1A is a cross-sectional illustration of a substrate, according to an embodiment of the invention.

Described herein are systems that include a semiconductor device and methods for forming the semiconductor device that includes non-planar IGZO transistors. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The use of a-IGZO in display technologies is particularly beneficial because the relative size of the transistors (compared to transistors used in integrated circuit (IC) chips, or the like) is not currently a critical concern. As such, large planar transistors do not typically cause problems when used in an active-matrix display. However, as the pixel sizes continue to decrease, there may be a need to scale down the size of a-IGZO transistors. Additionally, the large size of a-IGZO transistors limits the use of such devices to applications where size is not a concern. For example, large a-IGZO transistors that are currently available would occupy too much real estate on an IC.

Decreasing the size of a-IGZO transistors degrades the electrical properties as well. For example, as the size decreases, planar a-IGZO transistors increasingly suffer from undesirable short-channel effects, such as, high leakage current. Additionally, scaling down a planar a-IGZO transistor reduces the drive current. Accordingly, scaled down planar a-IGZO transistors suffer from high power consumption and overall reduced device performance.

Accordingly, embodiments of the invention include various non-planar transistor configurations that may be used to scale down the size of a-IGZO based transistors without significantly sacrificing electrical properties or reducing the manufacturability of the devices. In a non-planar device, the channel is surrounded by gate electrodes on multiple surfaces. The increased number of gated surfaces provides better electrical control over the channel. Accordingly, scaling problems described above, such as increased leakage current may be avoided while maintaining an acceptable drive current.

Furthermore, since a-IGZO transistors can be formed over any desired surface (i.e., a crystalline substrate is not needed for depositing a-IGZO), the non-planar a-IGZO transistors may be integrated into any location in a chip. Additionally, since low temperature processing (e.g., below approximately 400° C.) is used to deposit a-IGZO, embodiments of the invention can include forming the transistors in layers that have low thermal budgets. The combination of being formed on any substrate in addition to being formed with a low temperature process allows for a-IGZO transistors to be integrated into the back end of line (BEOL) stack. Accordingly, a-IGZO materials may be used to form logic applications for high voltage, low leakage back-end transistors. This is particularly beneficial since the real estate in the BEOL stack is not as costly as real estate on the semiconducting layer of the chip.

Embodiments of the invention include process flows that may be used to form various non-planar a-IGZO transistors. A first such process flow is illustrated and described below with respect to FIGS. 1A-1L.

Referring now to FIG. 1A, a cross-sectional illustration of a substrate 105 with a dielectric layer 106 formed over the surface is shown according to an embodiment of the invention. Implementations of the invention may be formed or carried out on a substrate, such as a semiconductor substrate. Due to the low temperature processing operations described in greater detail below, embodiments of the invention include using any substrate material. In one embodiment, the substrate 105 may be an interlayer dielectric (ILD) in a BEOL stack. For example, ILD substrates may be formed using dielectric materials known for their applicability in integrated circuit structures, such as low-k dielectric materials. Examples of dielectric materials that may be used for the substrate 105 include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. Additional embodiments may include a substrate 105 that is a glass substrate or any other rigid substrate typically used in display technologies. Embodiments of the invention may also include polymeric substrates 105. A polymeric substrate 105 may be a rigid or a flexible material. Forming the a-IGZO transistor on a flexible substrate 105 provides even greater freedom in design and may allow for inclusion of the a-IGZO transistors on wearable devices that are conformable to the user (e.g., watches, biomedical sensors, or the like). In one implementation, the substrate 105 may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate 105 may be formed are described here, any material that may serve as a foundation upon which a semiconductor device may be built falls within the spirit and scope of the present invention.

According to an embodiment of the invention, the dielectric layer 106 may be the same material as the substrate 105. Additional embodiments may include using a dielectric layer that is a different material than the substrate 105. In some embodiments of the invention, an etchstop layer (not shown) may be formed between the substrate 105 and the dielectric layer 106. Including an etchstop layer between the substrate 105 and the dielectric layer 106 may provide improved control to etching process used in subsequent processing operations.

Figure 1B:
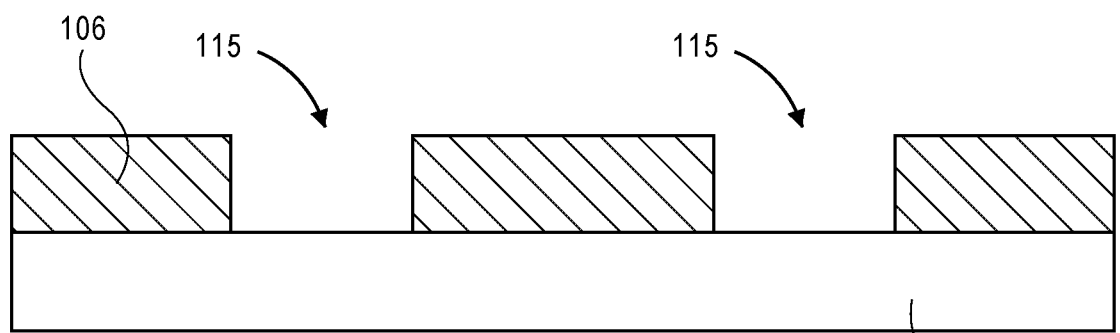
FIG. 1B is a cross-sectional illustration of the substrate in FIG. 1A after a dielectric formed over the substrate is patterned to form source and drain openings, according to an embodiment of the invention.

Referring now to FIG. 1B, a cross-sectional illustration of the dielectric layer 106 after source and drain openings 115 are patterned is shown according to an embodiment of the invention. For example, the dielectric layer 106 may be patterned with a photolithographic process known in the art.

Figure 1C:
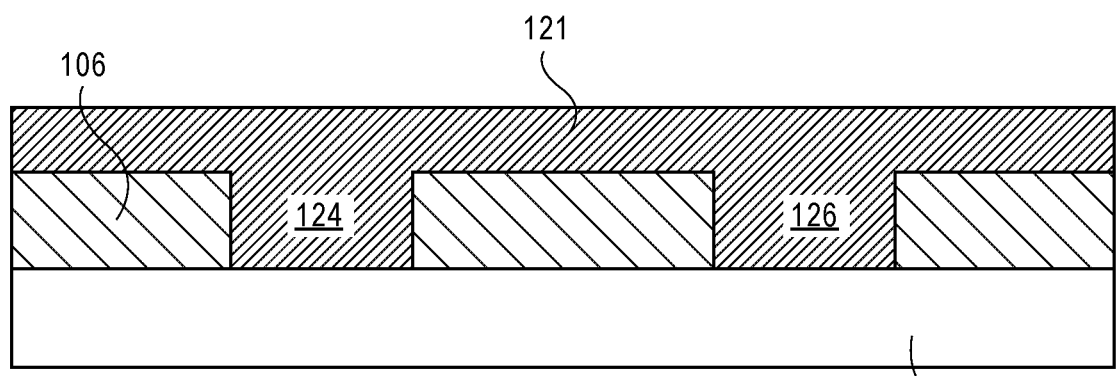
FIG. 1C is a cross-sectional illustration of the substrate in FIG. 1B after a metal layer is deposited into the openings and over the dielectric layer, according to an embodiment of the invention.

Referring now to FIG. 1C, a cross-sectional illustration of the dielectric layer 106 after a conductive material 121 is deposited over the surface is shown according to an embodiment of the invention. As illustrated, the deposited metal 121 may fill the source and drain openings 115 to form a source region 124 and a drain region 126. Additionally, the metal deposition process may deposit conductive material 121 over a top surface of the dielectric layer 106. According to an embodiment of the invention, the conductive material 121 may be deposited with any suitable process, such as electroless plating or the like. According to an embodiment, the conductive material may be any conductive material, such as a metallic material. In embodiments where the substrate 105 is a layer in a BEOL stack, the conductive material 121 may be the same conductive material used to form interconnect lines and vias (not shown) in the BEOL stack. By way of example, the conductive material may be copper.

Figure 1D:
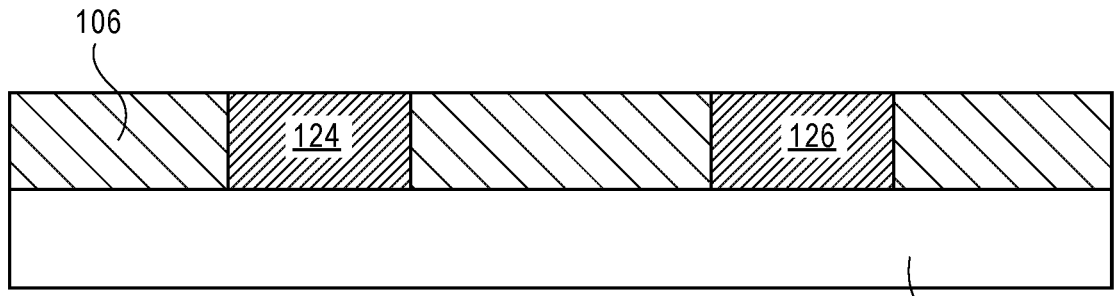
FIG. 1D is a cross-sectional illustration of the substrate in FIG. 1C after the metal layer is polished back to define source and drain regions, according to an embodiment of the invention.

Referring now to FIG. 1D, a cross-sectional illustration of the dielectric layer 106 and the source and drain regions 124/126 after the excess conductive material 121 has been removed is shown according to an embodiment of the invention. Removing the excess conductive material 121 from over the surface of the dielectric layer 106 electrically isolates the source region 124 from the drain region 126. According to an embodiment, the excess conductive material 121 may be removed with any suitable recessing process. For example, the excess conductive material 121 may be removed with an etching process or a chemical mechanical polishing (CMP) process.

Figure 1E:
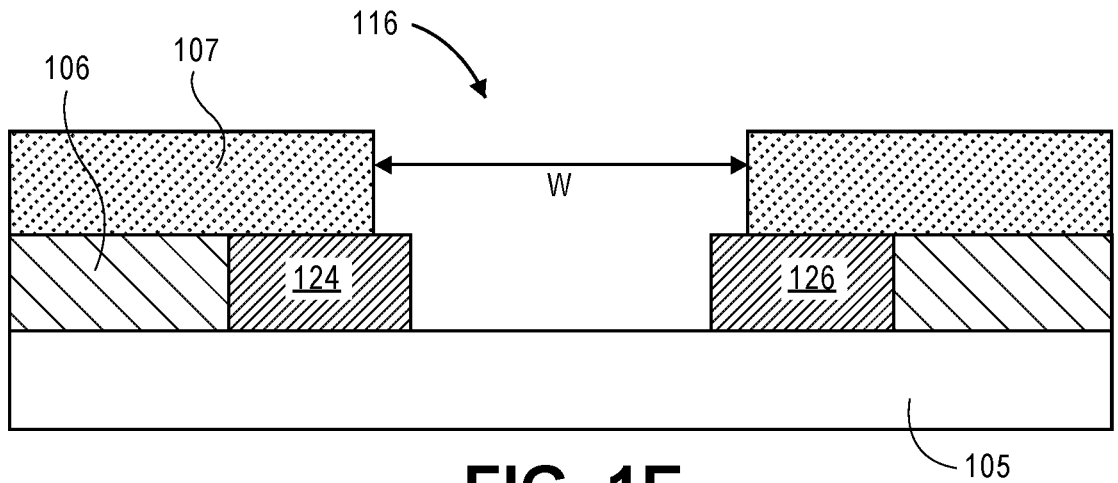
FIG. 1E is a cross-sectional illustration of the substrate in FIG. 1D after a hardmask is deposited and patterned to form a hardmask opening, according to an embodiment of the invention.

Referring now to FIG. 1E, a cross-sectional illustration of the device after a hardmask layer 107 is formed and patterned to form an opening 116 is shown according to an embodiment of the invention. As illustrated, the opening 116 in the hardmask 107 is substantially centered over the portion of the dielectric layer 106 formed between the source region 124 and the drain region 126. The opening 116 may have a width W that is greater than the width of the spacing between the source region 124 and the drain region 126. Having an opening with a width W greater than the spacing between the source region 124 and the drain region 126 allows for a degree of misalignment. However, it is noted that the width W of the opening should not be greater than the distance between the outer edges of the source region 124 and the drain region 126, or else unwanted portions of the dielectric layer 106 may be exposed.

Figure 1F:
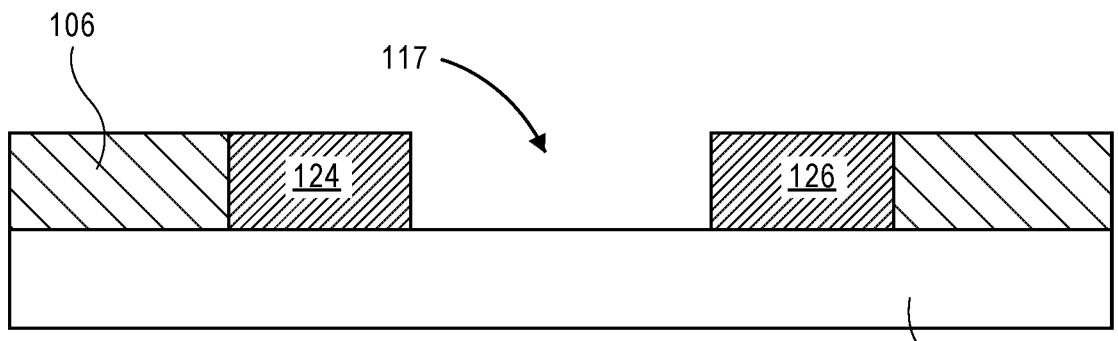
FIG. 1F is a cross-sectional illustration of the substrate in FIG. 1E after the hardmask opening is transferred into the dielectric layer to form a channel opening, according to an embodiment of the invention.

Referring now to FIG. 1F, a cross-sectional illustration of the dielectric layer 106 after the opening 116 in the hardmask layer 107 is transferred into the dielectric layer 106 to form a channel opening 117 is shown according to an embodiment of the invention. In an embodiment, the dielectric material may be removed with an etching process. In one process, the etching process may be a timed etch. Alternative embodiments may utilize an etchstop layer between the dielectric layer 106 and the substrate 105 to provide better control of the etching process. In such an embodiment, a first etching process may remove the dielectric material 106 and a second etching process may remove the etchstop layer. In an embodiment, the etchstop layer may also be left and subsequent structures formed in the channel opening 117 may be formed over the etchstop layer.

Figure 1G:
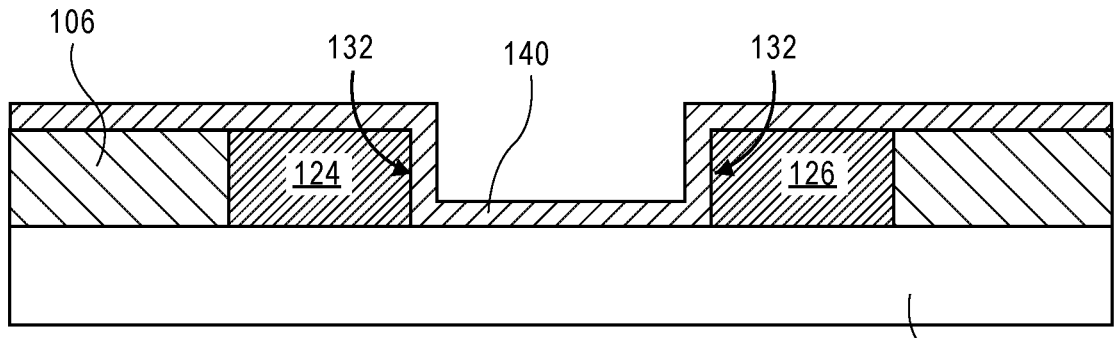
FIG. 1G is a cross-sectional illustration of the substrate in FIG. 1F after an a-IGZO layer is formed over the exposed surfaces, according to an embodiment of the invention.

Referring now to FIG. 1G, a cross-sectional illustration of the device after an a-IGZO layer 140 is formed over the exposed surfaces is shown according to an embodiment of the invention. In an embodiment, the a-IGZO layer 140 is a conformal layer that deposits along the sidewalls of the source region 124 and drain region 126 in addition to being formed along a bottom surface of the channel opening and over top surfaces of the dielectric layer 106, the source region 124, and the drain region 126. Accordingly, within the channel opening 117, the a-IGZO layer 140 may include sidewall portions formed in contact with the sidewalls of the source region 124 and the drain region 126, and a planar portion that is substantially parallel to a surface of the substrate 105. In an embodiment, the a-IGZO layer 140 may be deposited with a low temperature process. For example, the a-IGZO layer 140 may be deposited with a process that does not exceed approximately 400° C. In an embodiment, the a-IGZO layer 140 may be deposited with a physical vapor (PVD) deposition process (e.g., sputtering), a chemical vapor deposition (CVD) process, or atomic layer deposition (ALD).

Figure 1H:
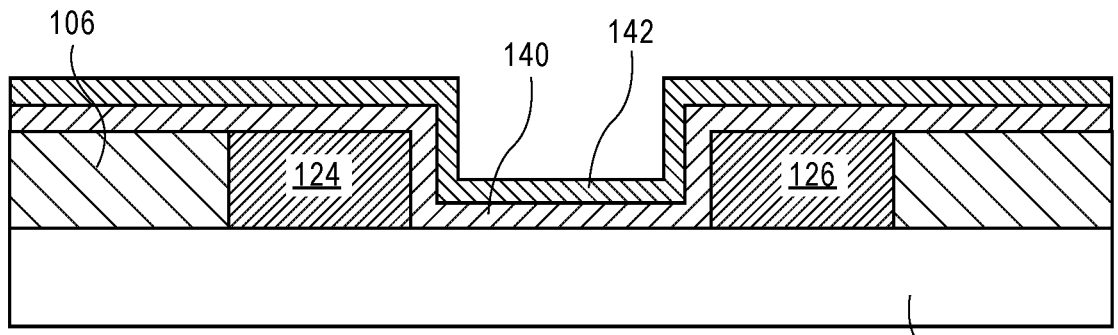
FIG. 1H is a cross-sectional illustration of the substrate in FIG. 1G after a gate dielectric layer is formed over the a-IGZO layer, according to an embodiment of the invention.

Referring now to FIG. 1H, a cross-sectional illustration of the device after a gate dielectric layer 142 is deposited over the a-IGZO layer 140 is shown according to an embodiment of the invention. In an embodiment, the gate dielectric layer 142 may contact more than one surface of the a-IGZO layer 140. For example, the gate dielectric 140 may contact sidewall surfaces of the IGZO layer 140 formed along the source and drain regions, and a planar surface of the a-IGZO 140 formed over the substrate 105. The gate dielectric layer 142 may include one layer or a stack of layers. The one or more layers may include silicon oxide, SiO2 and/or a high-k dielectric material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Figure 1I:
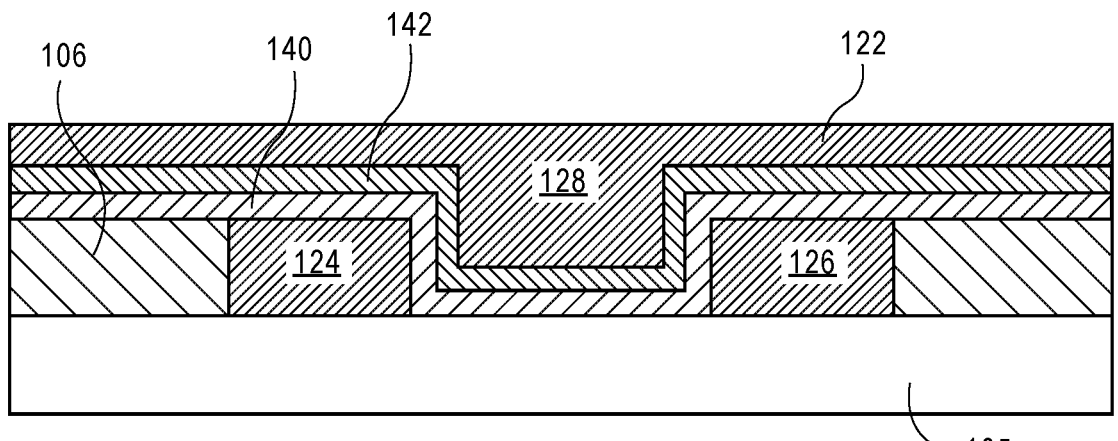
FIG. 1I is a cross-sectional illustration of the substrate in FIG. 1H after a gate electrode metal is deposited over the gate dielectric layer, according to an embodiment of the invention.

Referring now to FIG. 1I, a cross-sectional illustration of the device after a second conductive material 122 is deposited over the gate dielectric layer 142 is shown according to an embodiment of the invention. As illustrated, the second conductive material 122 may fill the trench above the gate dielectric layer 142 and extend over a top surface of the device. The portion of the conductive material 122 that is formed in the channel opening is the gate electrode 128. The conductive material 122 used to form the gate electrode 127 may consist of at least one P-type workfunction metal or N-type workfunction metal, depending on whether the transistor is to be a PMOS or an NMOS transistor. In some embodiments, the gate electrode 128 may consist of a stack of two or more metal layers, where one or more metal layers are workfunction metal layers and at least one metal layer is a fill metal layer. Embodiments of the invention include a low temperature deposition process. For example, the conductive material 122 may be deposited with a PVD process, such as sputtering.

For a PMOS transistor, metals that may be used for the gate electrode 128 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode 128 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

Figure 1J:
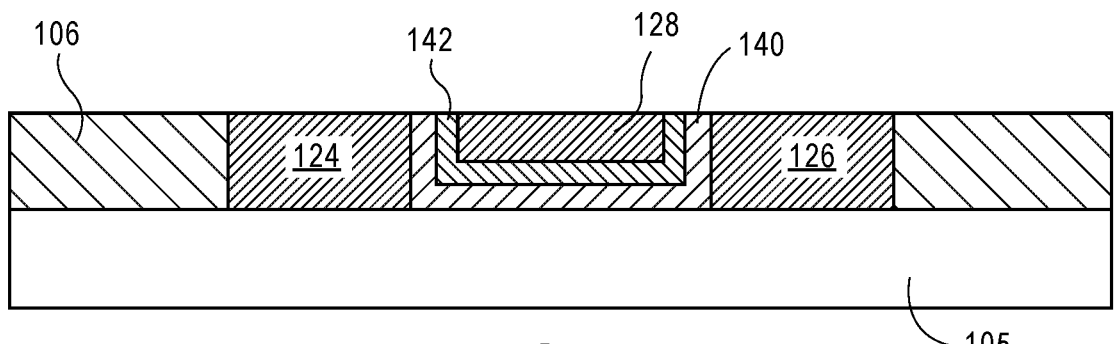
FIG. 1J is a cross-sectional illustration of the substrate in FIG. 1I after that gate electrode metal is polished back to define the gate electrode and the channel, according to an embodiment of the invention.

Referring now to FIG. 1J, a cross-sectional illustration of the device after the excess metal 122 is removed is shown according to an embodiment of the invention. Removing the excess conductive material 122 from over the surface of the dielectric layer 106 electrically isolates the gate electrode 128. Furthermore, it is to be appreciated that the processing operations used allow for the formation of a self-aligned gate electrode 128. Accordingly, no patterning processes are needed to form a gate electrode that is aligned above the channel. Additionally, the portions of the gate dielectric 142 and the a-IGZO layer 140 formed over the top surfaces of the dielectric layer 106, the source region 124, and the drain region 126 may be removed. According to an embodiment, the excess conductive material 122, the excess gate dielectric 142, and the excess a-IGZO 140 may be removed with any suitable recessing process. For example, the recessing process may include one or more etching processes and/or a chemical mechanical polishing (CMP) process.

Figure 1K:
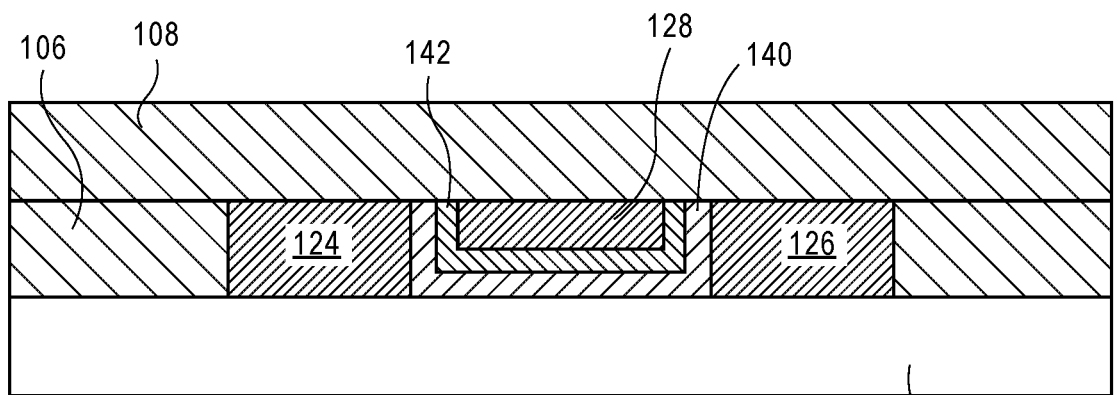
FIG. 1K is a cross-sectional illustration of the substrate in FIG. 1J after a second dielectric layer is deposited over the first dielectric layer, according to an embodiment of the invention.

Referring now to FIG. 1K, a cross-sectional illustration of the device after a second dielectric layer 108 is formed over the device is shown according to an embodiment of the invention. In an embodiment, the second dielectric layer 108 may be the same material as the first dielectric layer 106. In embodiments where the transistor device is formed in a BEOL stack, the second dielectric layer 108 may be the next layer in the stack. Additional embodiments include forming a second dielectric layer 108 that is a different material than the first dielectric layer 106.

Figure 1L:
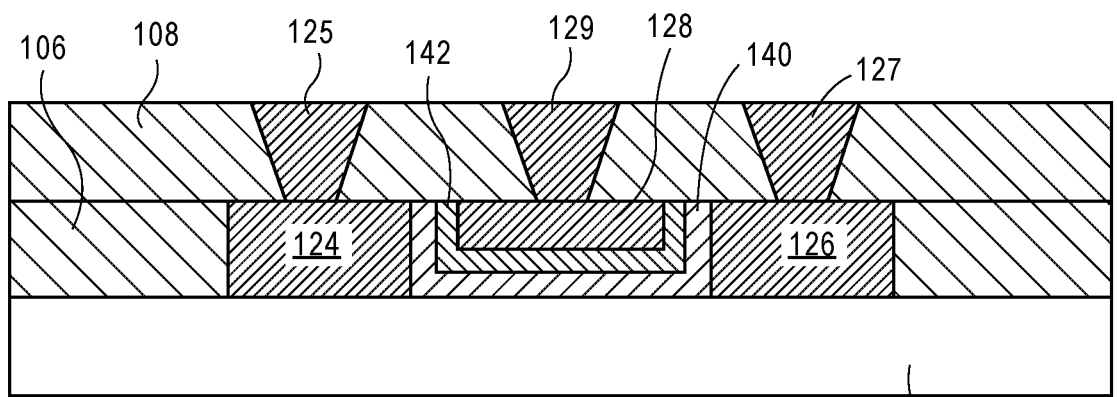
FIG. 1L is a cross-sectional illustration of the substrate in FIG. 1K after source, drain, and gate contacts are formed through the second dielectric layer, according to an embodiment of the invention.

Referring now to FIG. 1L, a cross-sectional illustration of the device after contacts are formed to the source, drain, and gate is shown according to an embodiment of the invention. As illustrated, a gate contact 129 contacts the gate electrode 128, the source contact 125 contacts the source region 124, and the drain contact 127 contacts the drain region 126. According to an embodiment, the contacts may be formed with a patterning and metal deposition process, as is known in the art. In an embodiment, the contacts 125, 127, 129 may be formed at the same time interconnects or vias (not shown) are formed in the BEOL stack.

The transistor illustrated in FIG. 1L may be considered a non-planar transistor because the a-IGZO channel 140 extends in both the lateral and vertical directions. The a-IGZO channel 140 extends in the lateral direction along the surface of the substrate 105 and in the vertical direction along the sidewalls of the source region 124 and the drain region 126. Accordingly, embodiments of the invention include a gate electrode that controls the channel along more than one surface.

According to additional embodiments of the invention, other non-planar a-IGZO transistors may be formed. For example, embodiments of the invention may include finfet a-IGZO transistors. A process for forming finfet a-IGZO transistors is illustrated and described with respect to FIGS. 2A-2H.

Figure 2A:
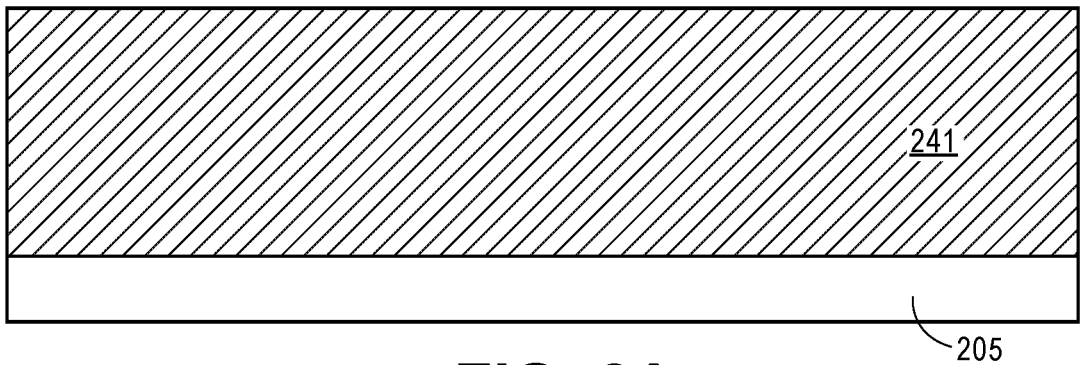
FIG. 2A is a cross-sectional illustration of a substrate with an a-IGZO layer formed over the substrate, according to an embodiment of the invention.

Referring now to FIG. 2A, a cross-sectional illustration of a device that includes a substrate 205 and an a-IGZO layer 241 formed over the substrate 205 is shown according to an embodiment of the invention. According to one embodiment, the substrate 205 may be an ILD in a BEOL stack. Additionally, the substrate 205 may be substantially similar to the substrate 105 described above, and therefore will not be described in detail here. The a-IGZO layer 241 may be any desired thickness. For example, the thickness chosen for the a-IGZO layer 241 may be dependent on how tall the subsequently formed fins need to be in order to provide the desired electrical properties. Similar to the a-IGZO layer 140 described above, the a-IGZO layer 241 may be formed with a low temperature processing operation, such as CVD or PVD that does not exceed a maximum processing temperature of approximately 400° C.

Figure 2B:
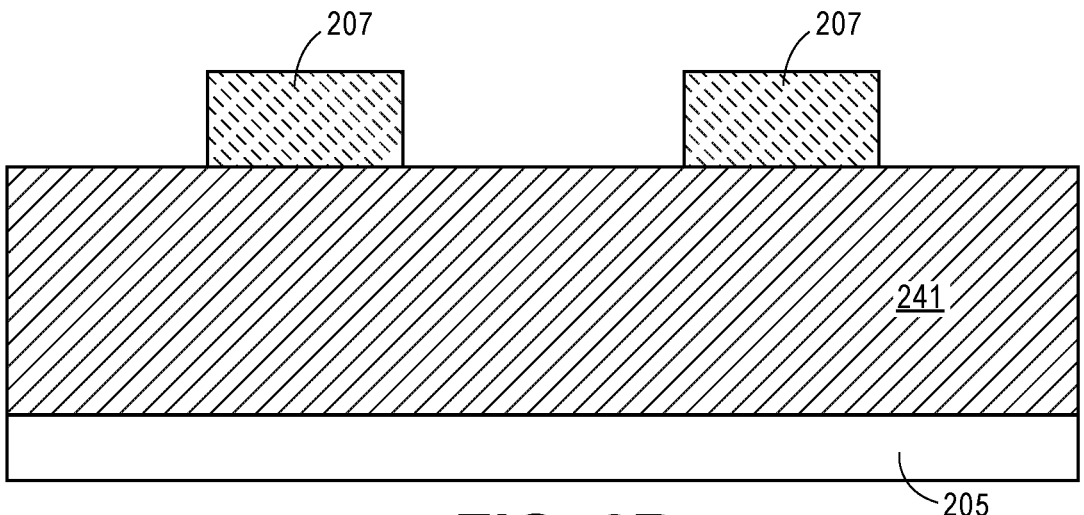
FIG. 2B is a cross-sectional illustration of the substrate in FIG. 2A after a mask layer is deposited over the a-IGZO layer and patterned, according to an embodiment of the invention.

Referring now to FIG. 2B, a cross-sectional illustration of the device after a patterned hardmask layer 207 is formed over the a-IGZO layer 241 is shown according to an embodiment of the invention. According to an embodiment, the patterned hardmask 207 may be formed over portions of the a-IGZO layer 241 where a fin is desired to be formed.

Figure 2C:
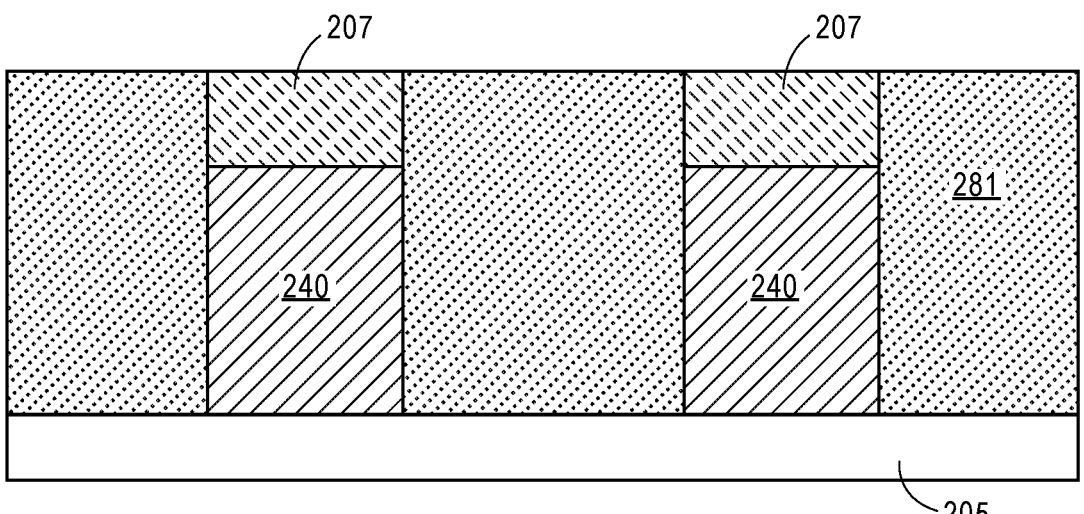
FIG. 2C is a cross-sectional illustration of the substrate in FIG. 2B after the mask layer is used to etch a-IGZO fins and an oxide is formed between neighboring fins, according to an embodiment of the invention.

Referring now to FIG. 2C, a cross-sectional illustration of the device after the a-IGZO layer 241 is patterned to form a-IGZO fins 240 is shown according to an embodiment of the invention. In an embodiment, the hardmask layer 207 may mask portions of the a-IGZO layer 241 from being etched during an etching process. For example, the fins 240 may be formed with an anisotropic etch, such as a plasma dry-etching process. According to an embodiment, dielectric layer 281 may be deposited between the fins 240. For example, the dielectric layer 281 may be a shallow trench isolation (STI).

Figure 2D:
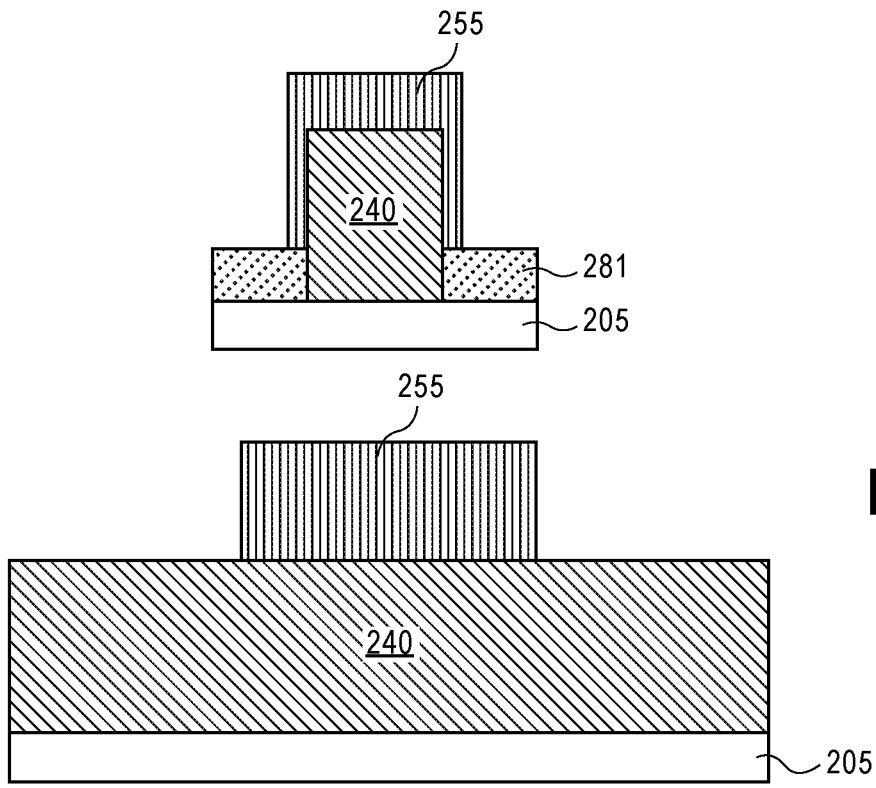
FIG. 2D is a pair of cross-sectional illustrations of one of the a-IGZO fins illustrated in FIG. 2C along the length and width of the fin after a dummy gate has been formed over the fin, according to an embodiment of the invention.

Referring now to FIG. 2D, a pair of cross-sectional illustrations of the device along the length of the fin (bottom figure) and width of the fin (top figure) after the hard mask is removed and a dummy gate electrode is formed over the fin are shown according to an embodiment of the invention. According to an embodiment, the dummy gate electrode 255 may be formed after the dielectric layer 281 is recessed below a top surface of the fin 240. In an embodiment, the dummy gate electrode may be formed with a blanket deposition process, and then defined with an etching process, as is known in the art. In an embodiment, the dummy gate electrode 255 may be any material that is etch selective to the a-IGZO fin 240. As illustrated in the cross-sectional view along the width of the fin, the dummy gate electrode may extend over a top surface of the fin 240 and along the sidewalls of the fin 240.

Figure 2E:
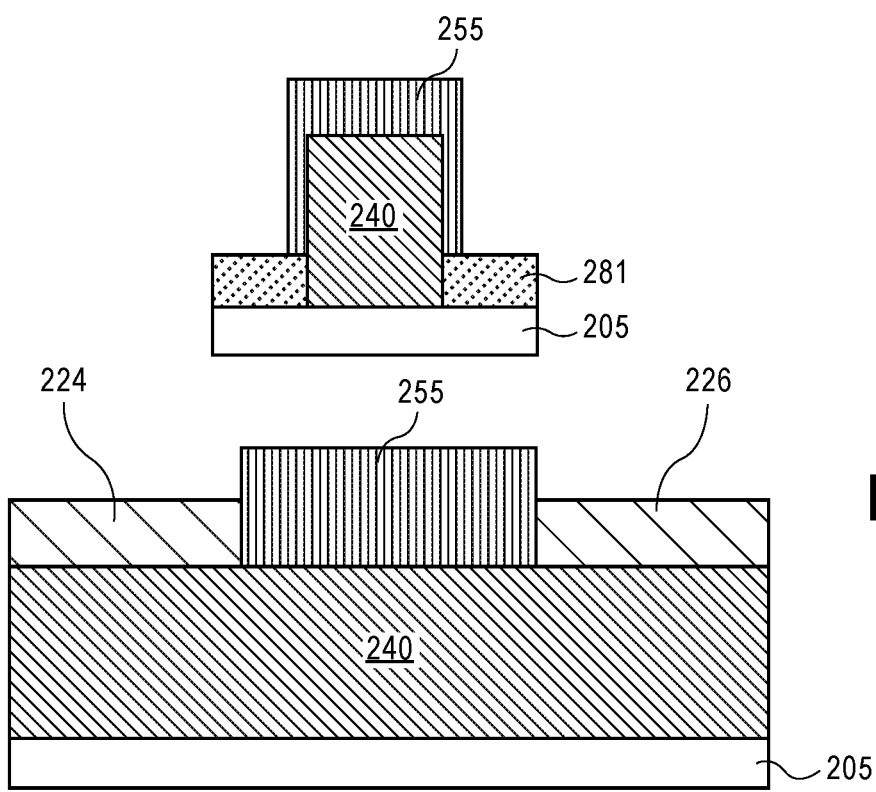
FIG. 2E is a pair of cross-sectional illustrations of the a-IGZO fin illustrated in FIG. 2D along the length and width of the fin after a source and drain region have been formed over the fin, according to an embodiment of the invention.

Referring now to FIG. 2E, a pair of cross-sectional illustrations of the device along the length of the fin (bottom figure) and width of the fin (top figure) after the source region 224 and drain region 226 are formed are shown according to an embodiment of the invention. According to an embodiment, the source region 224 and the drain region 226 may be any conductive material, such as a metallic material. In embodiments where the substrate 205 is a layer in a BEOL stack, the source region 224 and the drain region 226 may be the same conductive material used to form interconnect lines and vias (not shown) in the BEOL stack. By way of example, the conductive material may be copper.

It is to be appreciated that in the illustrated embodiment, the dummy gate electrode 255 does not include sidewall spacers, however embodiments are not limited to such configurations. For example, the sidewall spacers may optionally be formed with any suitable material or process. The use of sidewall spacers on the dummy gate electrode 255 is described in greater detail below. Embodiments of the invention may omit sidewall spacers on the dummy gate electrode when the gate dielectric material deposited in a subsequent processing operation is able to provide adequate separation between the sidewalls of the source region 224 and the drain region 226 and the gate electrode, as will be described in greater detail below.

Figure 2F:
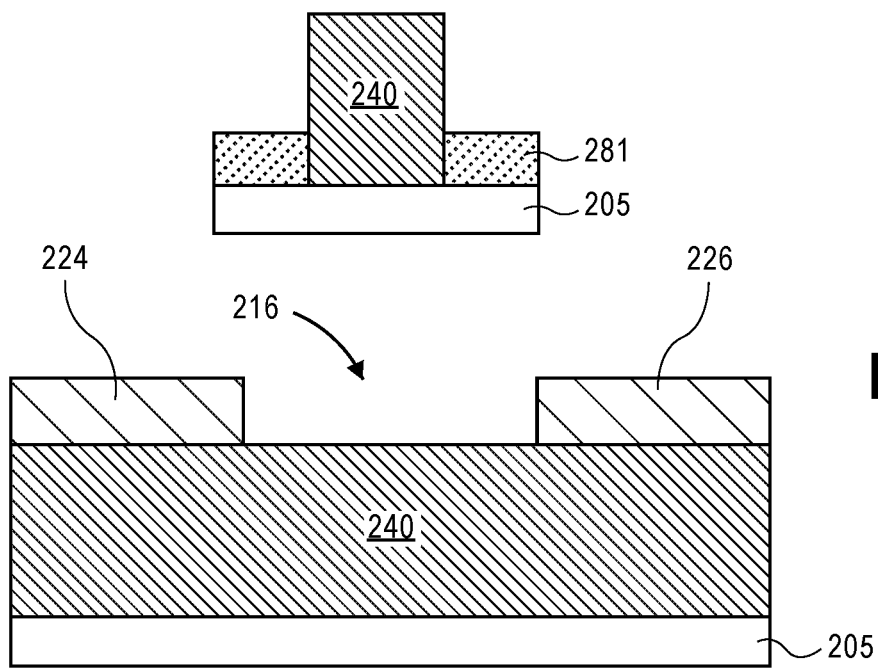
FIG. 2F is a pair of cross-sectional illustrations of the a-IGZO fin illustrated in FIG. 2E along the length and width of the fin after the dummy gate is removed, according to an embodiment of the invention.

Referring now to FIG. 2F, a pair of cross-sectional illustrations of the device along the length of the fin (bottom figure) and width of the fin (top figure) after the dummy gate electrode is removed are shown according to an embodiment of the invention. In an embodiment, the dummy gate electrode 255 may be removed with an etching process that selectively removes the dummy gate electrode 255 without substantially removing portions of the source region 224, drain region 226, or the a-IGZO fin 240. The removal of the dummy gate electrode 255 forms an opening 216 between the source region 224 and the drain region 226. The opening exposes a portion of the fin 240 that will function as the channel region of the transistor.

Figure 2G:
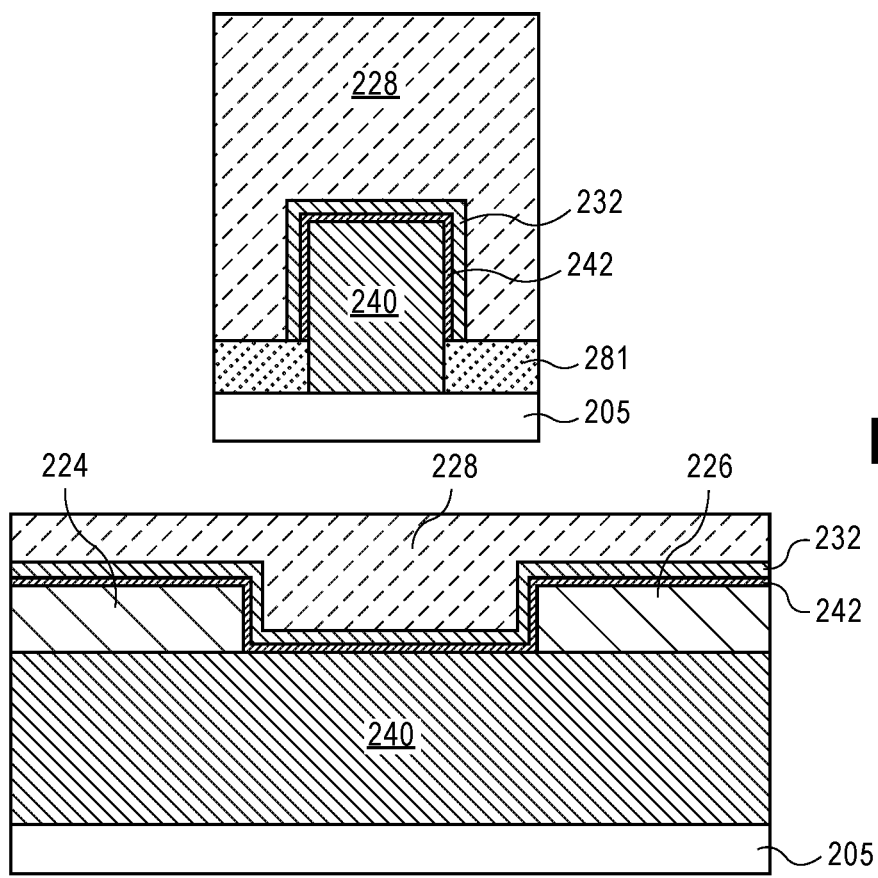
FIG. 2G is a pair of cross-sectional illustrations of the a-IGZO fin illustrated in FIG. 2F along the length and width of the fin after a gate dielectric, a gate workfunction metal, and a gate electrode is formed over the fin, according to an embodiment of the invention.

Referring now to FIG. 2G, a pair of cross-sectional illustrations of the device along the length of the fin (bottom figure) and width of the fin (top figure) after a gate dielectric layer 242, a gate workfunction layer 232 and a gate electrode 228 are formed are shown according to an embodiment of the invention. In an embodiment, the gate dielectric layer 242 may contact more than one surface of the a-IGZO fin 240. For example, the cross-sectional view along the width of the fin illustrates that the gate dielectric layer 242 contacts sidewall surfaces of the a-IGZO fin 240 and a top surface of the a-IGZO fin 240. According to an embodiment, the gate dielectric layer 242 may include one layer or a stack of layers. The one or more layers may include silicon oxide, SiO2 and/or any suitable high-k dielectric material. The gate dielectric layer 242 may be substantially similar to the gate dielectric layer 142 described above, and therefore will not be described in greater detail here. However, it is noted that the thickness of the portion of the gate dielectric layer 242 formed along the sidewalls of the source region 224 and the drain region 226 may function as a spacer that allows for the optional omission of sidewall spacers on the dummy gate electrode 255 described above.

In an embodiment the gate workfunction layer 232 and the gate electrode 228 may be any suitable conductive material, similar to the gate electrode 128 described above. For example, the gate workfunction layer 232 may be the work-function metal. As such, the material choice for the gate workfunction layer 232 may be dependent on whether the device will be a PMOS or NMOS transistor, as described above.

Figure 2H:
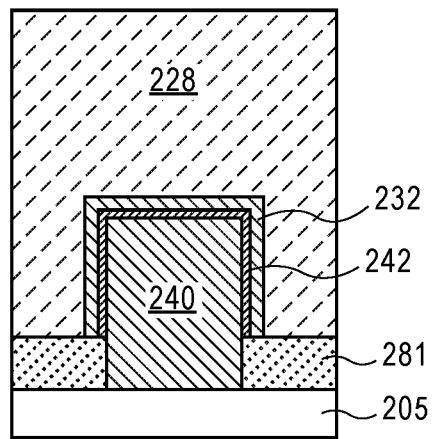
FIG. 2H is a pair of cross-sectional illustrations of the a-IGZO fin illustrated in FIG. 2G along the length and width of the fin after the gate electrode is recessed, according to an embodiment of the invention.
Figure 2H:
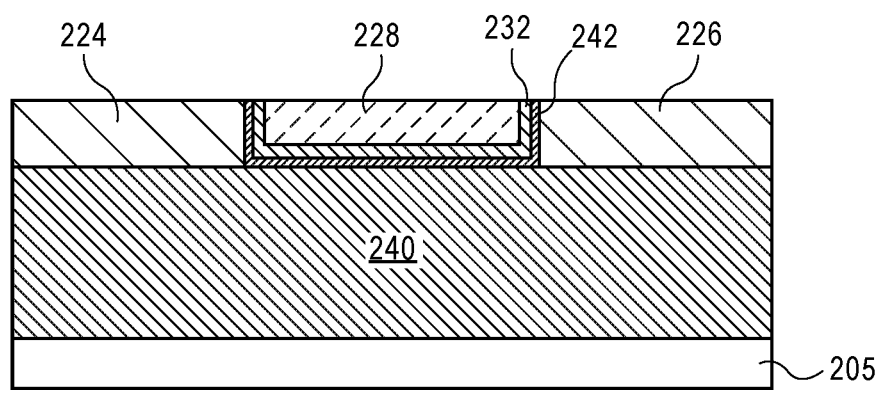

Referring now to FIG. 2H, a pair of cross-sectional illustrations of the device along the length of the fin (bottom figure) and width of the fin (top figure) after the gate electrode 228 and the gate workfunction layer 232 are recessed are shown according to an embodiment of the invention. Removing the excess conductive material 228 and 232 from over the surface of the source region 224 and the drain region 226 electrically isolates the gate electrode 228 and the gate workfunction layer 232. Furthermore, it is to be appreciated that the processing operations used allow for the formation of a self-aligned gate electrode 228. Accordingly, no patterning processes are needed to form a gate electrode that is aligned above the channel. Additionally, the portions of the gate dielectric 242 formed over the top surfaces of the source region 224 and the drain region 226 may be removed. According to an embodiment, the excess material from the gate workfunction layer 232, the gate electrode 228, and the gate dielectric layer 242, may be removed with any suitable recessing process. For example, the recessing process may include one or more etching processes and/or a CMP process.

As shown in the cross-sectional view along the width of the fin 240 in FIG. 2H, the gate electrode 228 may consist of a "U"-shaped structure that includes a bottom portion substantially parallel to the surface of the substrate 205 and two sidewall portions that are substantially perpendicular to the top surface of the substrate 205. Accordingly, embodiments of the invention include a gate electrode 228 that controls the channel of the fin 240 along more than one surface.

According to additional embodiments of the invention, other non-planar a-IGZO transistors may be formed. For example, embodiments of the invention may include nanowire or nanoribbon a-IGZO transistors. A process for forming such a-IGZO transistors is illustrated and described with respect to FIGS. 3A-3I.

Figure 3A:
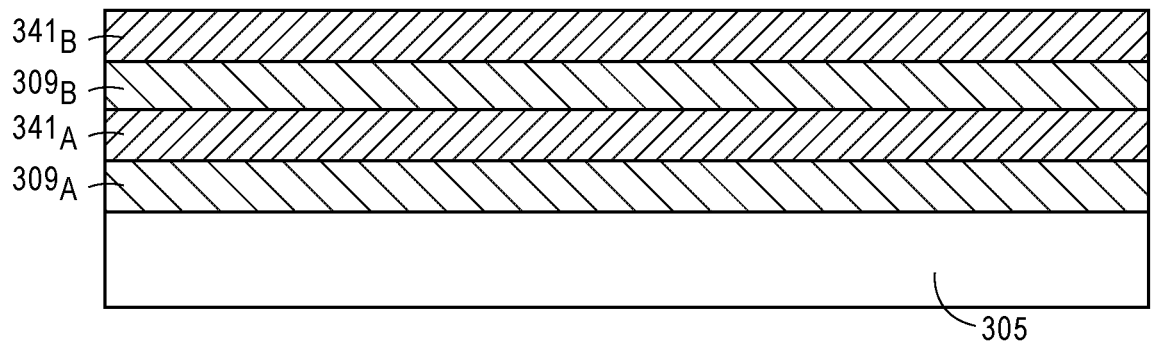
FIG. 3A is a cross-sectional illustration of a substrate with a plurality of alternating a-IGZO layers and sacrificial layers formed over the substrate, according to an embodiment of the invention.

Referring now to FIG. 3A, a cross-sectional illustration of a device that includes a plurality of a-IGZO layers 341 in an alternating pattern with a plurality of sacrificial layers 309 formed over the substrate 205 is shown according to an embodiment of the invention. In the illustrated embodiment, there a first a-IGZO layer 341A and a second a-IGZO layer 341B are alternating with a first sacrificial layer 309A and a second sacrificial layer 309B. However, it is to be appreciated that any number of a-IGZO layers 341 may be used according to embodiments of the invention. Embodiments of the invention may include materials for the sacrificial layers 309 that are etch selective to the a-IGZO layers 341. For example, the sacrificial layer may be a sputtered amorphous Ge layer that can be deposited at approximately 400° C. or less.

According to one embodiment, the substrate 305 may be an ILD in a BEOL stack. Additionally, the substrate 305 may be substantially similar to the substrate 105 described above, and therefore will not be described in detail here. The a-IGZO layers 341 may be any desired thickness. For example, the thickness chosen for the a-IGZO layers 341 may be dependent on the desired thickness of nanowires or nanoribbons needed in order to provide the desired electrical properties in the finished transistor. Similar to the a-IGZO layer 140 described above, the a-IGZO layers 341 may be formed with a low temperature processing operation, such as CVD or PVD that does not exceed a maximum temperature of approximately 400° C.

Figure 3B:
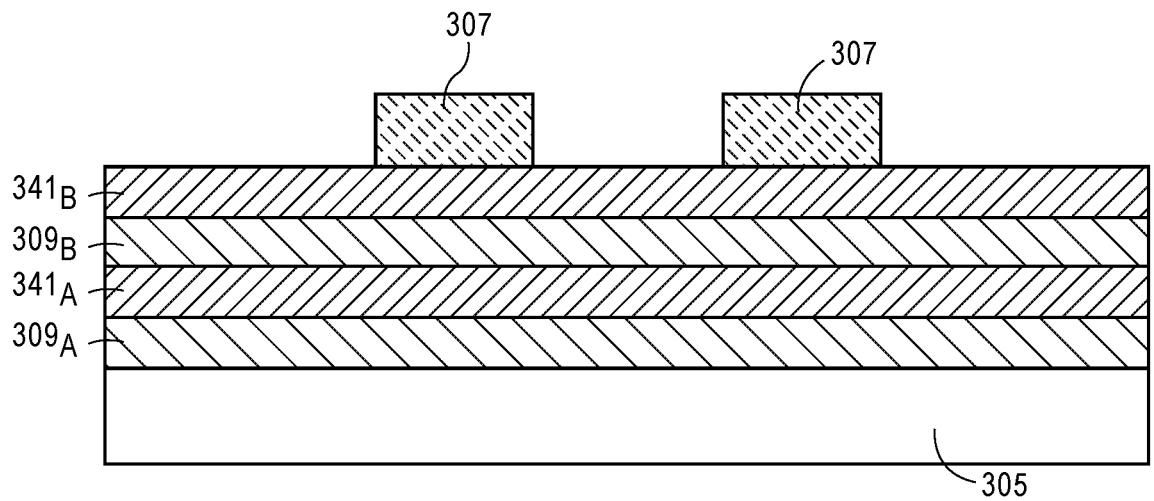
FIG. 3B is a cross-sectional illustration of the substrate in FIG. 3A after a mask layer is deposited over the alternating a-IGZO layers and sacrificial layers and patterned, according to an embodiment of the invention.

Referring now to FIG. 3B, a cross-sectional illustration of the device after a patterned hardmask layer 307 is formed over the a-IGZO layer 341 is shown according to an embodiment of the invention. According to an embodiment, the patterned hardmask 307 may be formed over portions of the layer where a fin is desired to be formed.

Figure 3C:
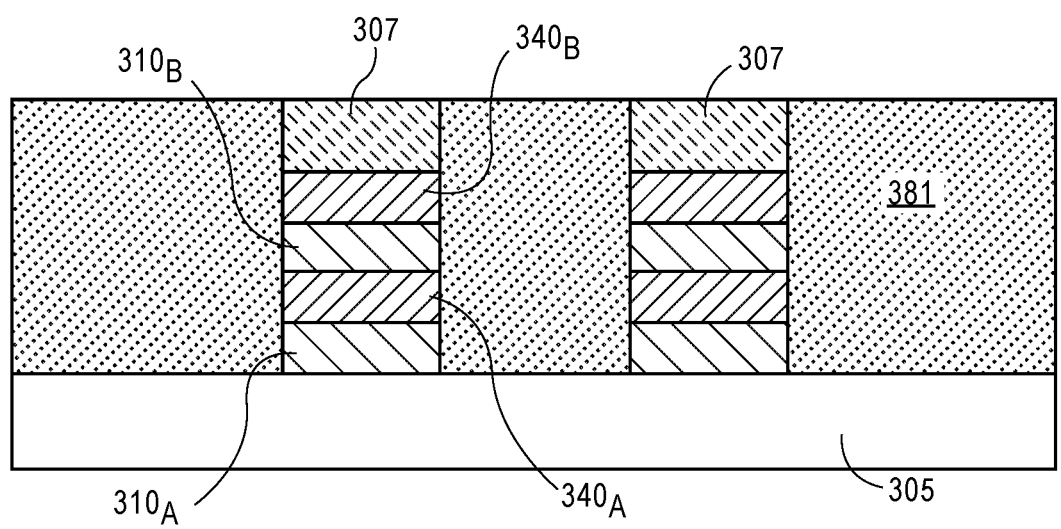
FIG. 3C is a cross-sectional illustration of the substrate in FIG. 3B after the mask layer is used to etch fins that include alternating a-IGZO layers and sacrificial layers and an oxide is formed between neighboring fins, according to an embodiment of the invention.

Referring now to FIG. 3C, a cross-sectional illustration of the device after the alternating layers of a-IGZO 341 and sacrificial material 309 are patterned to form fins 340/310 is shown according to an embodiment of the invention. The fins may include include alternating layers of a-IGZO 340 and sacrificial material 310. In an embodiment, the hardmask layer 307 may mask portions of the a-IGZO/sacrificial material stack 341/309 from being etched during an etching process. For example, the fins 310/340 may be formed with an anisotropic etch, such as a plasma dry-etching process. In an embodiment, a single etching chemistry may be used that etches both the sacrificial material 309 and the a-IGZO material 341. Additional embodiments include multiple etching chemistries that selectively etch one of the two layers. According to an embodiment, dielectric layer 381 may be deposited between the fins 310/340. For example, the dielectric layer 381 may be an STI.

Figure 3D:
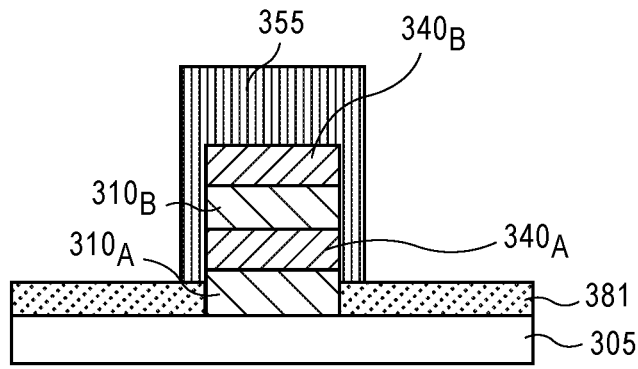
FIG. 3D is a pair of cross-sectional illustrations of one of the fins illustrated in FIG. 3C along the length and width of the fin after a dummy gate has been formed over the fin, according to an embodiment of the invention.
Figure 3D:
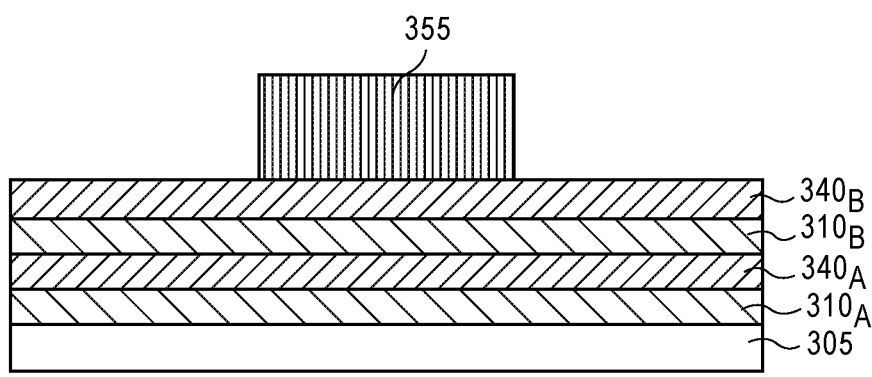

Referring now to FIG. 3D, a pair of cross-sectional illustrations of the device along the length of the fin (bottom figure) and width of the fin (top figure) after the hard mask is removed and a dummy gate electrode is formed over the fin 310/340 are shown according to an embodiment of the invention. According to an embodiment, the dummy gate electrode 355 may be formed after the dielectric layer 381 is recessed below a top surface of the fin 310/340. In an embodiment, the dummy gate electrode 355 may be formed with a blanket deposition process, and then defined with an etching process, as is known in the art. In an embodiment, the dummy gate electrode 355 may be any material that is etch selective to the a-IGZO fin layers 340. As illustrated in the cross-sectional view along the width of the fin, the dummy gate electrode 355 may extend over a top surface of the a-IGZO fin layer 340B and along the sidewalls of the fin (i.e., over portions of the sacrificial fin layers 310 and the a-IGZO fin layers 340).

Figure 3E:
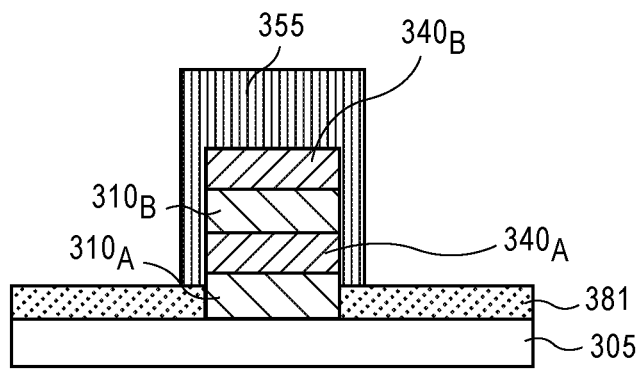
FIG. 3E is a pair of cross-sectional illustrations of the fin illustrated in FIG. 3D along the length and width of the fin after spacers are formed along the sidewalls of the dummy gate, according to an embodiment of the invention.
Figure 3E:
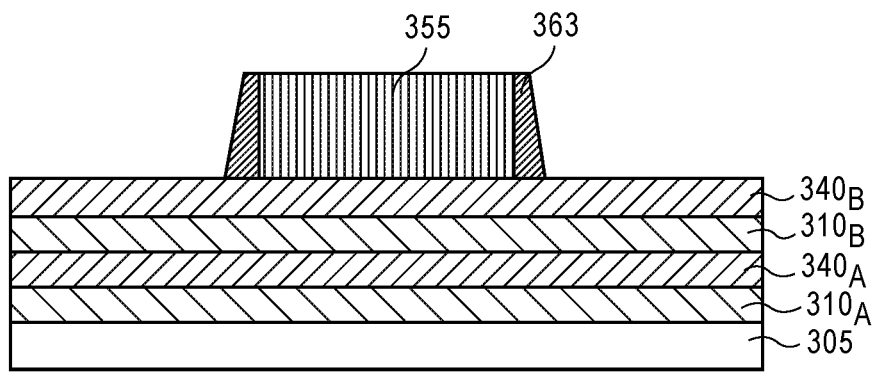

Referring now to FIG. 3E, a pair of cross-sectional illustrations of the device along the length of the fin (bottom figure) and width of the fin (top figure) after sidewall spacers 363 are formed along the sidewalls of the dummy gate electrode 355. The sidewall spacers 363 may be formed from a material such as silicon nitride, silicon oxide, silicon carbide, silicon nitride doped with carbon, and silicon oxynitride. Processes for forming sidewall spacers 363 are well known in the art and generally include deposition and etching process steps. In an alternate implementation, a plurality of spacer pairs may be used, for instance, two pairs, three pairs, or four pairs of sidewall spacers 363 may be formed on opposing sides of the gate stack.

Figure 3F:
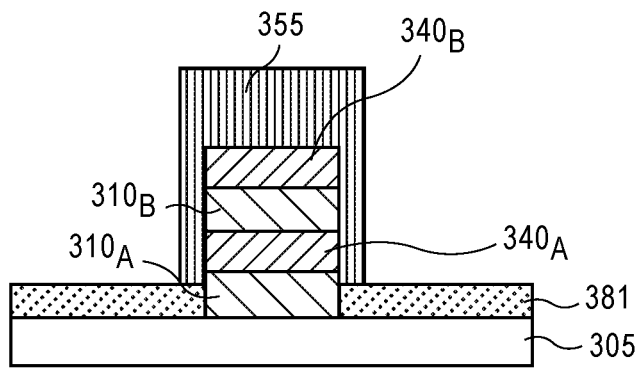
FIG. 3F is a pair of cross-sectional illustrations of the fin illustrated in FIG. 3E along the length and width of the fin after a source and drain region have been formed over the fin, according to an embodiment of the invention.
Figure 3F:
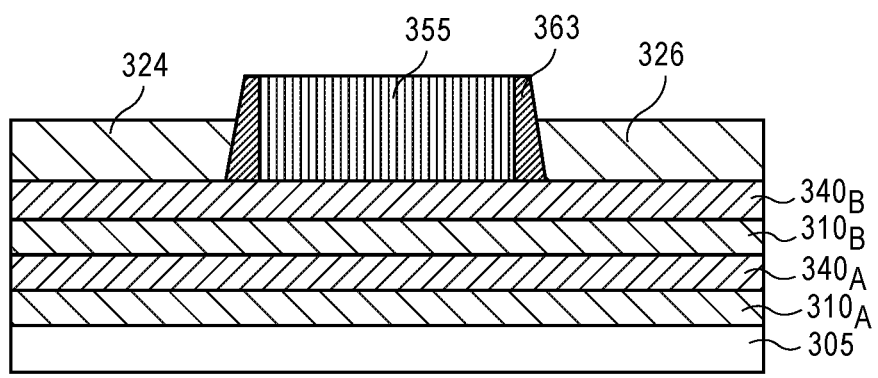

Referring now to FIG. 3F, a pair of cross-sectional illustrations of the device along the length of the fin (bottom figure) and width of the fin (top figure) after the source region 324 and drain region 326 are formed are shown according to an embodiment of the invention. According to an embodiment, the source region 324 and the drain region 326 may be any conductive material, such as a metallic material. In embodiments where the substrate 305 is a layer in a BEOL stack, the source region 324 and the drain region 326 may be the same conductive material used to form interconnect lines and vias (not shown) in the BEOL stack. By way of example, the conductive material may be copper.

Figure 3G:
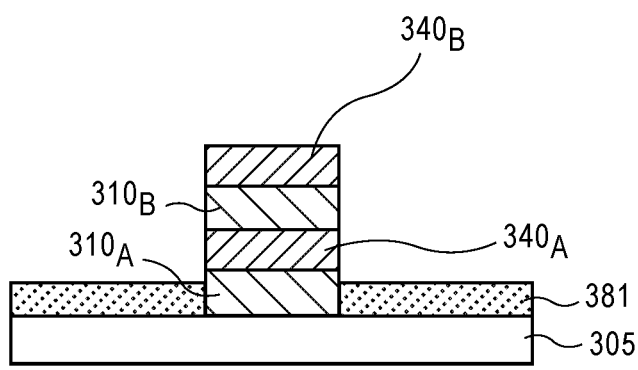
FIG. 3G is a pair of cross-sectional illustrations of the fin illustrated in FIG. 3F along the length and width of the fin after the dummy gate is removed, according to an embodiment of the invention.
Figure 3G:
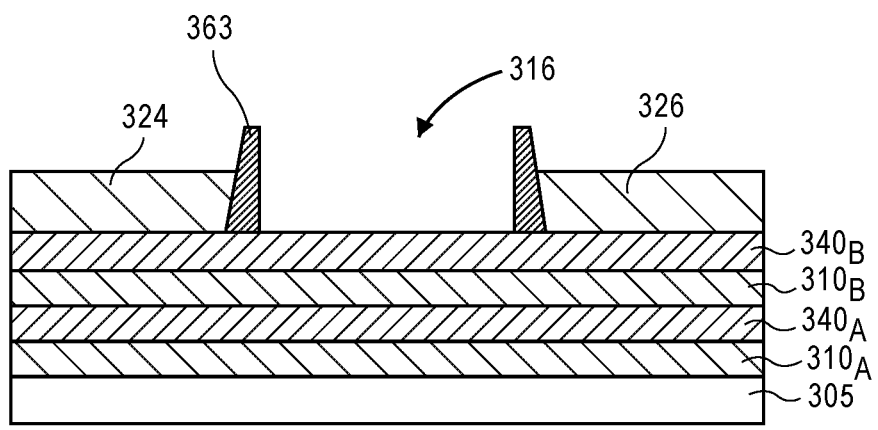

Referring now to FIG. 3G, a pair of cross-sectional illustrations of the device along the length of the fin (bottom figure) and width of the fin (top figure) after the dummy gate electrode is removed are shown according to an embodiment of the invention. In an embodiment, the dummy gate electrode 355 may be removed with an etching process that selectively removes the dummy gate electrode 355 without substantially removing portions of the source region 324, drain region 326, or the a-IGZO fin 340. The removal of the dummy gate electrode 355 forms an opening 316 between the source region 324 and the drain region 326. The opening exposes a portion of the a-IGZO fin layers 340 that will be formed into a nanowire or nanoribbon portion of the transistor.

Figure 3H:
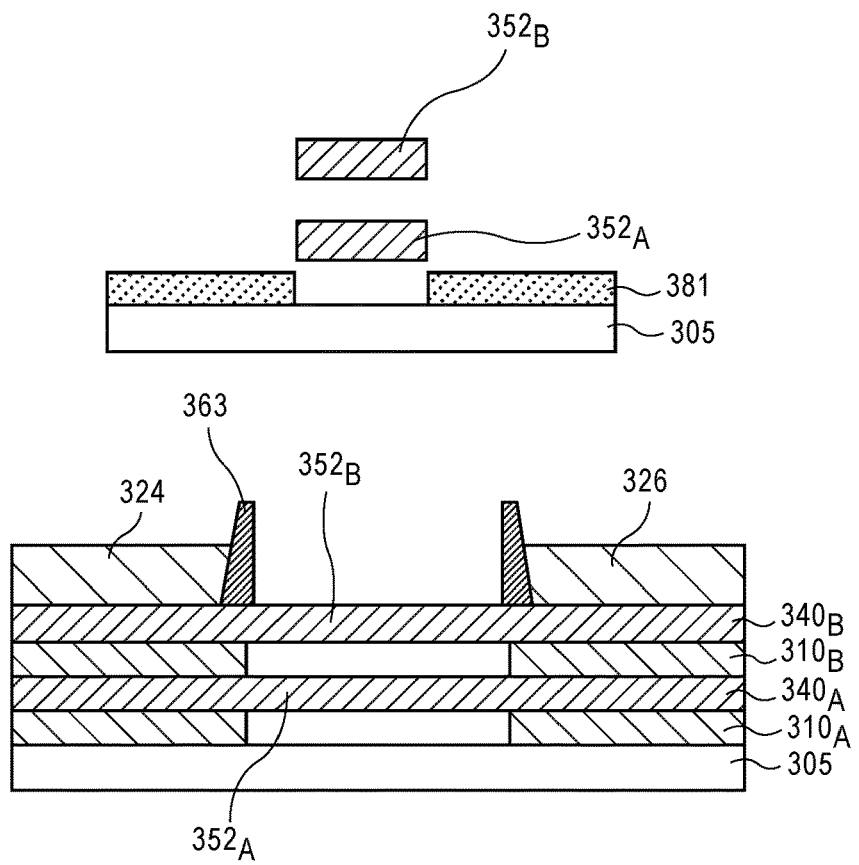
FIG. 3H is a pair of cross-sectional illustrations of the fin illustrated in FIG. 3G along the length and width of the fin after the portion of the sacrificial layer between the spacers is removed, according to an embodiment of the invention.

Referring now to FIG. 3H, a pair of cross-sectional illustrations of the device along the length of the fin (bottom figure) and width of the fin (top figure) after the portion of the sacrificial fin layers 310 between the sidewall spacers 363 is selectively removed. For example, a wet etch that selectively removes the sacrificial material 310 while leaving the a-IGZO material 340 substantially unaltered may be used. By way of example, an $H_2O_2$ mixture in water can be used to etch away the sacrificial layer 310 (e.g., a-Ge) selectively over the a-IGZO layers 340. Accordingly, nanowires 352A/352B (or nanoribbons depending on the geometry of the layers 340) are formed. It is to be appreciated that while the nanowires 352 in the cross-sectional view along the width of the fin appear to be floating, they are attached to the remainder of the fin, as illustrated in the second cross-sectional view.

Figure 3I:
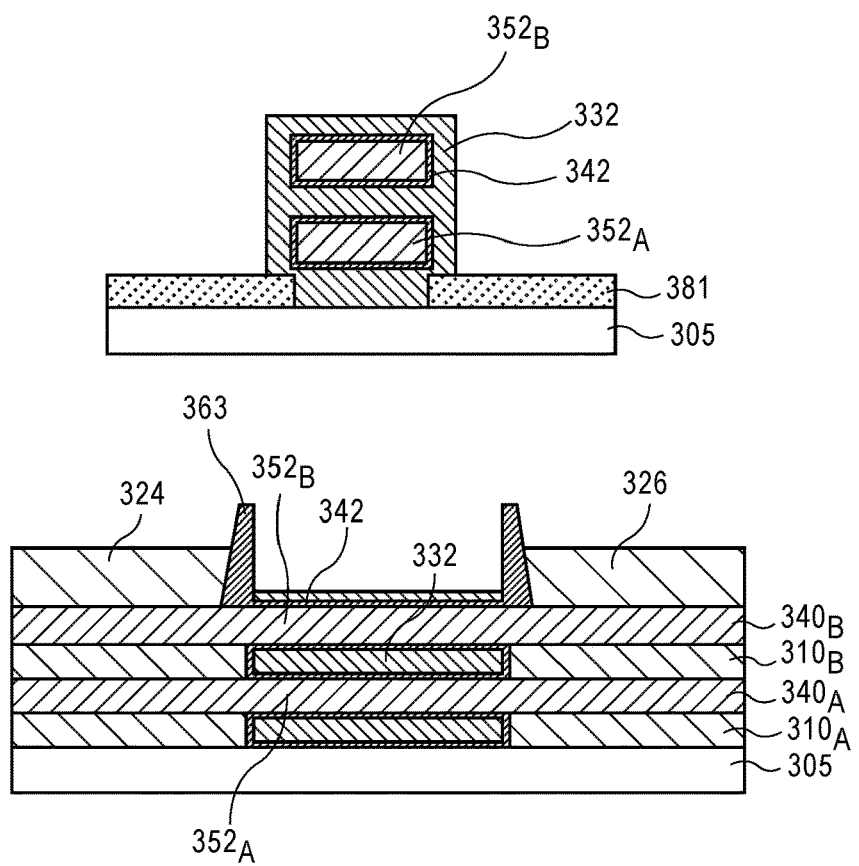
FIG. 3I is a pair of cross-sectional illustrations of the fin illustrated in FIG. 3H along the length and width of the fin after a gate dielectric and a gate workfunction metal is formed over the a-IGZO nanowires, according to an embodiment of the invention.

Referring now to FIG. 3I, a pair of cross-sectional illustrations of the device along the length of the fin (bottom figure) and width of the fin (top figure) after a gate dielectric layer 342 and a gate workfunction layer 332 are formed around the nanowires 352 are shown according to an embodiment of the invention. In an embodiment, the gate dielectric layer 342 may contact more than one surface of the a-IGZO nanowires 352. For example, the cross-sectional view along the width of the film illustrates that the gate dielectric layer 342 complete encircles the a-IGZO nanowires 352 (i.e., the dielectric layer 342 contacts all surfaces of the a-IGZO nanowires 352). According to an embodiment, the gate dielectric layer 342 may include one layer or a stack of layers. The one or more layers may include silicon oxide, SiO2 and/or any suitable high-k dielectric material. The gate dielectric layer 342 may be substantially similar to the gate dielectric layer 142 described above, and therefore will not be described in greater detail here. In an embodiment the gate workfunction layer 332 may be any suitable conductive material that provides a desired workfunction depending on whether the device will be a PMOS or NMOS transistor, as described above.

Figure 3J:
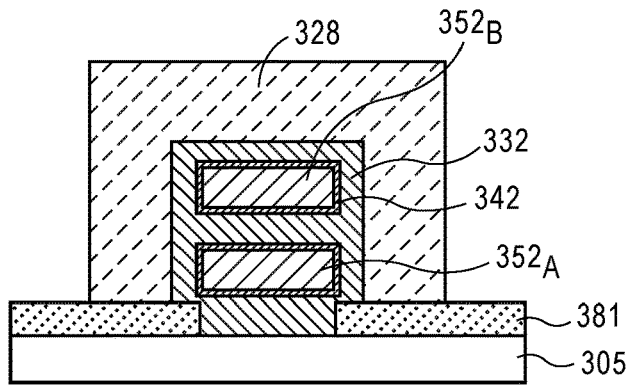
FIG. 3J is a pair of cross-sectional illustrations of the fin illustrated in FIG. 3I along the length and width of the fin after a gate electrode is deposited and recessed, according to an embodiment of the invention.
Figure 3J:
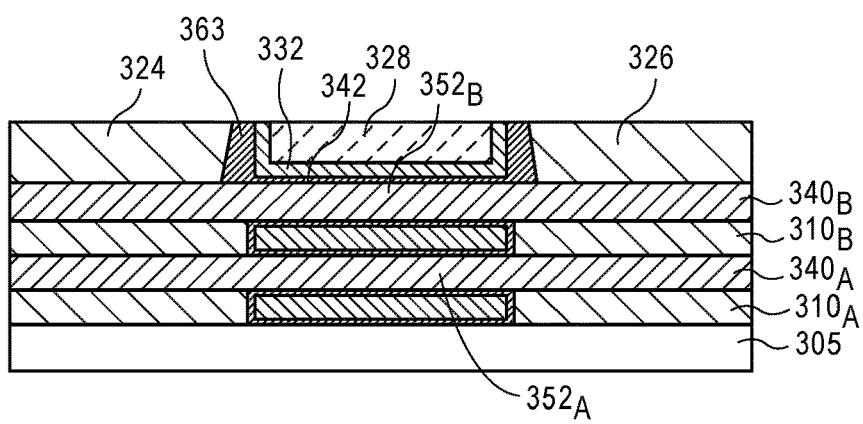

Referring now to FIG. 3J, a pair of cross-sectional illustrations of the device along the length of the fin (bottom figure) and width of the fin (top figure) after the gate electrode 328 is deposited and the device is planarized are shown according to an embodiment of the invention. Removing the excess conductive material 328 from over the surface of the source region 324 and the drain region 326 electrically isolates the gate electrode 328 and the gate workfunction layer 332. Furthermore, it is to be appreciated that the processing operations used allow for the formation of a self-aligned gate electrode 328. Accordingly, no patterning processes are needed to form a gate electrode that is aligned above the channel (i.e., over the nanowires 352). Additionally, portions of the gate dielectric 342 that may have been formed over the top surfaces of the source region 324 and the drain region 326 may be removed with the recessing process as well. According to an embodiment, the recessing process may include one or more etching processes and/or a CMP process.

As shown in the cross-sectional view along the width of the fin nanowires 352 in FIG. 3J, the gate electrode 328 may consist of a "U"-shaped structure that includes a bottom portion substantially parallel to the surface of the substrate 305 and two sidewall portions that are substantially perpendicular to the top surface of the substrate 305. Additionally, the gate electrode 328 and/or the gate workfunction layer 332 may wrap completely around the nanowires to form a gate-all-around (GAA) structure. Accordingly, embodiments of the invention include a gate electrode 328 that controls the channel nanowires 352 along more than one surface.

According to additional embodiments of the invention, other non-planar a-IGZO transistors may be formed. For example, embodiments of the invention may include nanowire or nanoribbon a-IGZO transistors that are formed without sidewall spacers. A process for forming such a-IGZO transistors is illustrated and described with respect to FIGS. 4A-4E. The initial processing operations used to form nanowire or nanoribbon a-IGZO transistors without sidewall spacers are substantially similar to those described above with respect to FIGS. 3A-3D. As such, FIG. 4A is an illustration of the next processing operation after the device in FIG. 3D is formed.

Figure 4A:
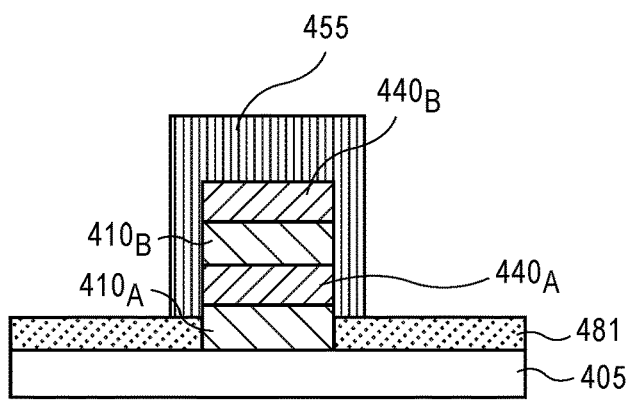
FIG. 4A is a pair of cross-sectional illustrations of the fin illustrated in FIG. 3D along the length and width of the fin after a source and drain region have been formed over the fin, according to an embodiment of the invention.
Figure 4A:
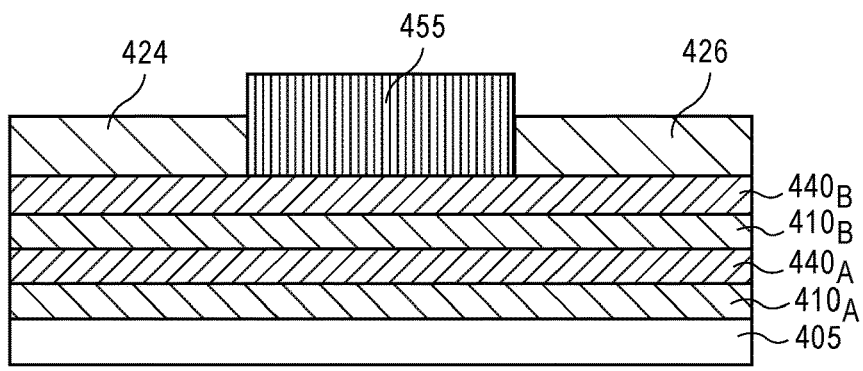

Referring now to FIG. 4A, a pair of cross-sectional illustrations of the device along the length of the fin (bottom figure) and width of the fin (top figure) after the source region 424 and drain region 426 are formed are shown according to an embodiment of the invention. According to an embodiment, the source region 424 and the drain region 426 may be any conductive material, such as a metallic material. In embodiments where the substrate 405 is a layer in a BEOL stack, the source region 424 and the drain region 426 may be the same conductive material used to form interconnect lines and vias (not shown) in the BEOL stack. By way of example, the conductive material may be copper.

It is to be appreciated that in the illustrated embodiment, the dummy gate electrode 455 does not include sidewall spacers. Embodiments of the invention may omit sidewall spacers on the dummy gate electrode when the gate dielectric material deposited in a subsequent processing operation is able to provide adequate separation between the sidewalls of the source region 424 and the drain region 426 and the gate electrode, as will be described in greater detail below.

Figure 4B:
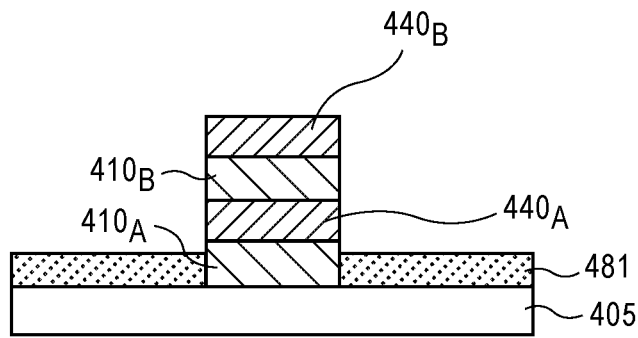
FIG. 4B is a pair of cross-sectional illustrations of the fin illustrated in FIG. 4A along the length and width of the fin after the dummy gate is removed, according to an embodiment of the invention.
Figure 4B:
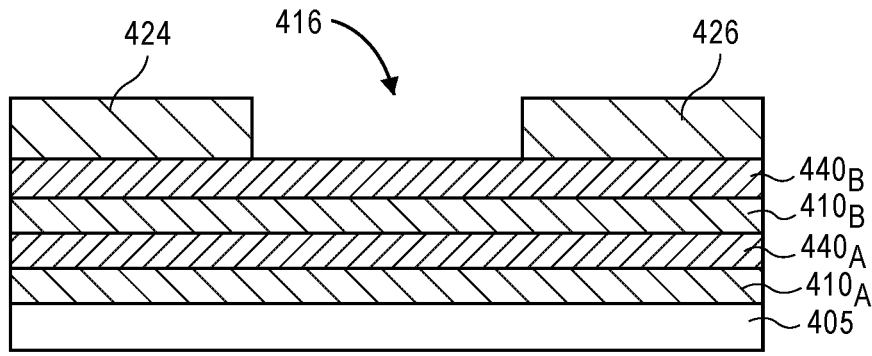

Referring now to FIG. 4B, a pair of cross-sectional illustrations of the device along the length of the fin (bottom figure) and width of the fin (top figure) after the dummy gate electrode is removed are shown according to an embodiment of the invention. In an embodiment, the dummy gate electrode 455 may be removed with an etching process that selectively removes the dummy gate electrode 455 without substantially removing portions of the source region 424, drain region 426, or the a-IGZO fin 440. The removal of the dummy gate electrode 455 forms an opening 416 between the source region 424 and the drain region 426. The opening exposes a portion of the a-IGZO fin layers 440 that will be formed into a nanowire or nanoribbon portion of the transistor.

Figure 4C:
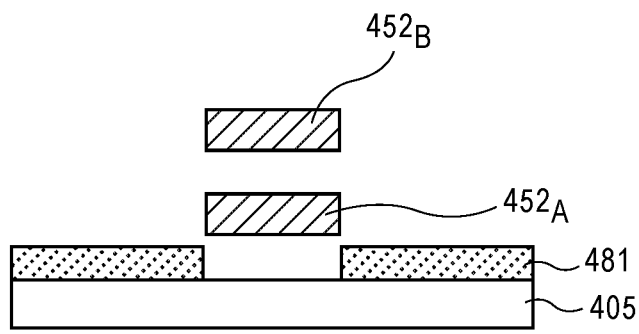
FIG. 4C is a pair of cross-sectional illustrations of the fin illustrated in FIG. 4B along the length and width of the fin after the portion of the sacrificial layer between the source and drain regions is removed, according to an embodiment of the invention.
Figure 4C:
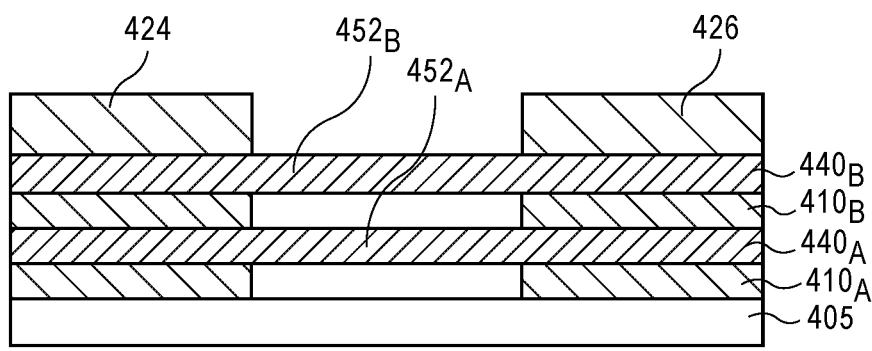

Referring now to FIG. 4C, a pair of cross-sectional illustrations of the device along the length of the fin (bottom figure) and width of the fin (top figure) after the portion of the sacrificial fin layers 410 between the source region 424 and the drain region 426 is selectively removed. For example, a wet etch that selectively removes the sacrificial material 410 while leaving the a-IGZO material 440 substantially unaltered may be used. Accordingly, nanowires 452A/452B (or nanoribbons depending on the geometry of the layers 440) are formed. It is to be appreciated that while the nanowires 452 in the cross-sectional view along the width of the fin appear to be floating, they are attached to the remainder of the fin, as illustrated in the second cross-sectional view.

Figure 4D:
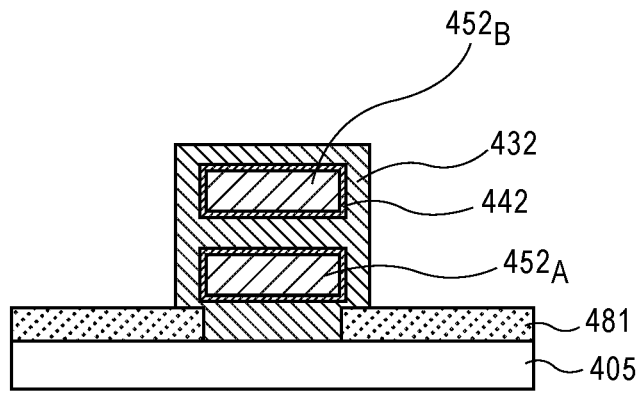
FIG. 4D is a pair of cross-sectional illustrations of the fin illustrated in FIG. 4C along the length and width of the fin after a gate dielectric and a gate workfunction metal is formed over the fin, according to an embodiment of the invention.
Figure 4D:
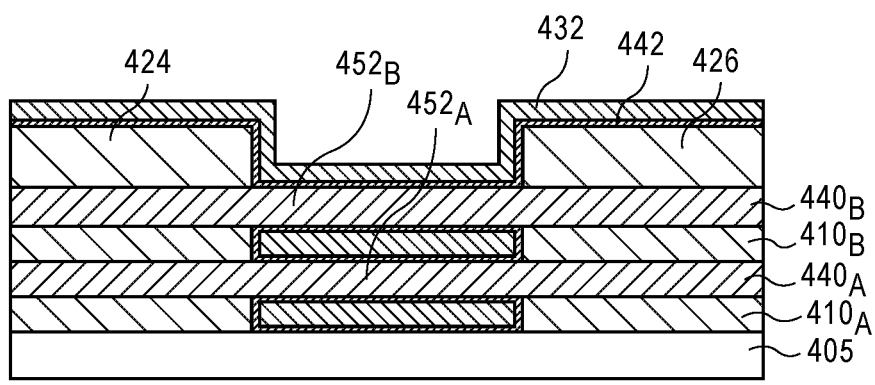

Referring now to FIG. 4D, a pair of cross-sectional illustrations of the device along the length of the fin (bottom figure) and width of the fin (top figure) after a gate dielectric layer 442 and a gate workfunction layer 432 are formed around the nanowires 452 are shown according to an embodiment of the invention. In an embodiment, the gate dielectric layer 442 may contact more than one surface of the a-IGZO nanowires 452. For example, the cross-sectional view along the width of the film illustrates that the gate dielectric layer 442 complete encircles the a-IGZO nanowires 452 (i.e., the dielectric layer 442 contacts all surfaces of the a-IGZO nanowires 452). According to an embodiment, the gate dielectric layer 442 may include one layer or a stack of layers. The one or more layers may include silicon oxide, SiO2 and/or any suitable high-k dielectric material. The gate dielectric layer 442 may be substantially similar to the gate dielectric layer 142 described above, and therefore will not be described in greater detail here. However, it is noted that the thickness of the portion of the gate dielectric layer 442 formed along the sidewalls of the source region 424 and the drain region 426 may function as a spacer that allows for the optional omission of sidewall spacers on the dummy gate electrode 455 described above. In an embodiment the gate workfunction layer 432 may be any suitable conductive material that provides a desired workfunction depending on whether the device will be a PMOS or NMOS transistor, as described above.

Figure 4E:
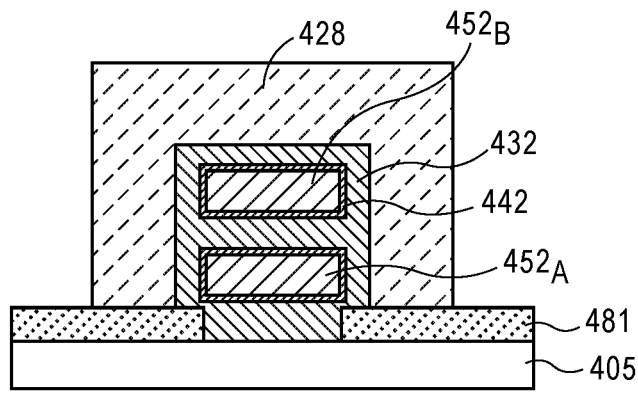
FIG. 4E is a pair of cross-sectional illustrations of the fin illustrated in FIG. 4D along the length and width of the fin after a fill metal is deposited and recessed, according to an embodiment of the invention.
Figure 4E:
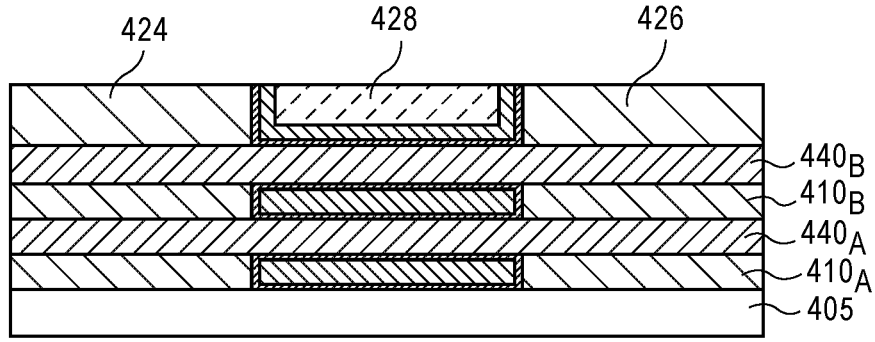

Referring now to FIG. 4E, a pair of cross-sectional illustrations of the device along the length of the fin (bottom figure) and width of the fin (top figure) after the gate electrode 428 is deposited and the device is planarized are shown according to an embodiment of the invention. Removing the excess conductive material 428 from over the surface of the source region 424 and the drain region 426 electrically isolates the gate electrode 428 and the gate workfunction layer 432. Furthermore, it is to be appreciated that the processing operations used allow for the formation of a self-aligned gate electrode 428. Accordingly, no patterning processes are needed to form a gate electrode that is aligned above the channel (i.e., over the nanowires 452). Additionally, portions of the gate dielectric 442 that may have been formed over the top surfaces of the source region 424 and the drain region 426 may be removed with the recessing process as well. According to an embodiment, the recessing process may include one or more etching processes and/or a CMP process.

As shown in the cross-sectional view along the width of the fin nanowires 452 in FIG. 4E, the gate electrode 428 may consist of a "U"-shaped structure that includes a bottom portion substantially parallel to the surface of the substrate 405 and two sidewall portions that are substantially perpendicular to the top surface of the substrate 405. Additionally, the gate electrode 428 and/or the gate workfunction layer 432 may wrap completely around the nanowires to for a GAA structure. Accordingly, embodiments of the invention include a gate electrode 428 that controls the channel nanowires 452 along more than one surface.

Figure 5:
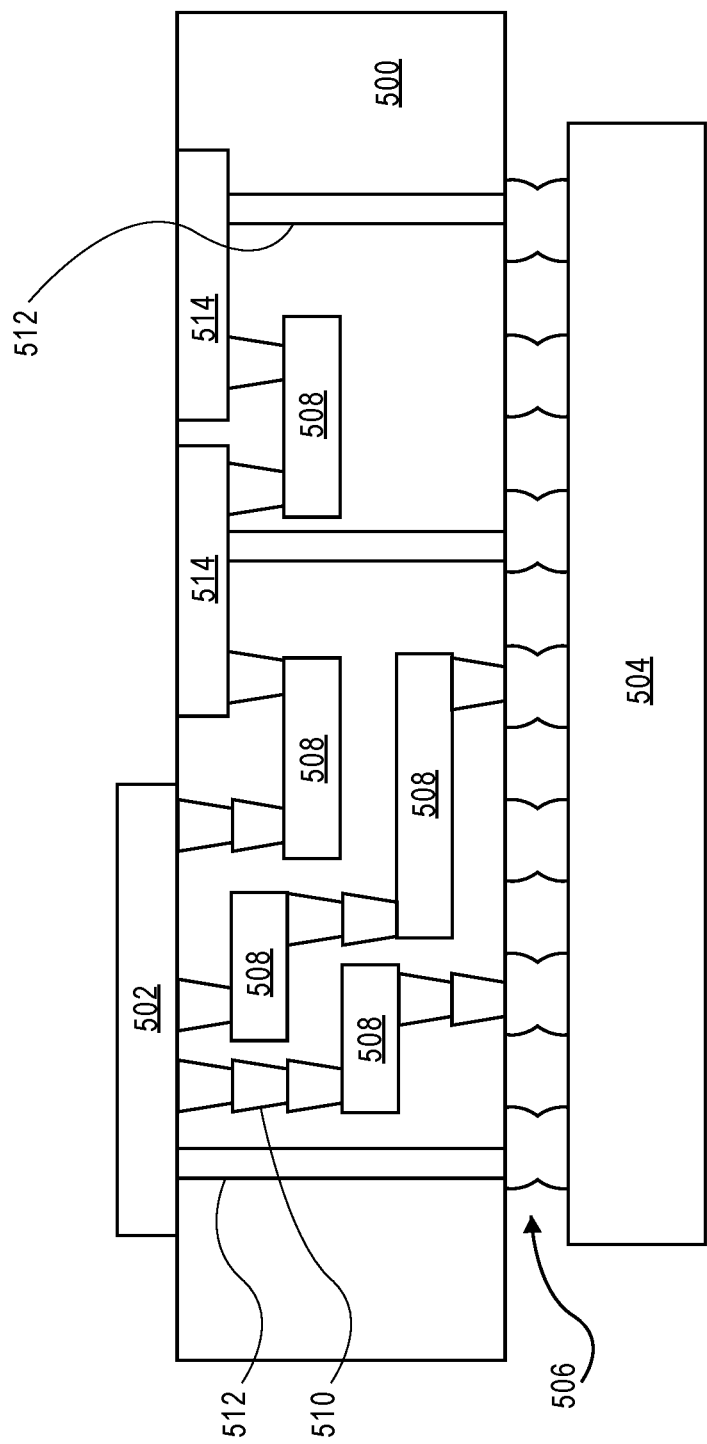
FIG. 5 is a cross-sectional illustration of an interposer implementing one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the invention, apparatuses that include non-planar a-IGZO transistors, or processes for forming such devices disclosed herein may be used in the fabrication of interposer 500.

Figure 6:
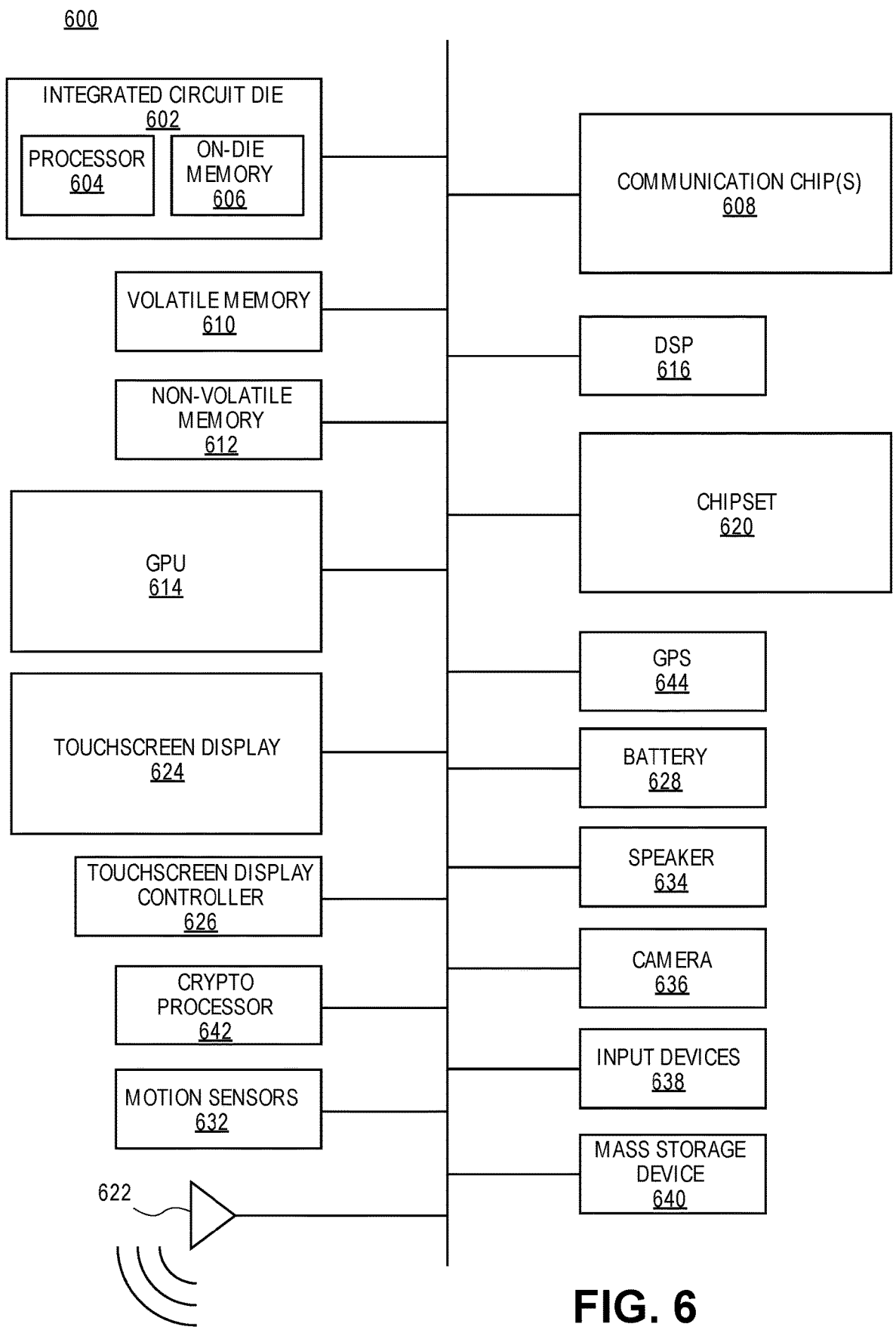
FIG. 6 is a schematic of a computing device that includes one or more transistors built in accordance with an embodiment of the invention.

FIG. 6 illustrates a computing device 600 in accordance with one embodiment of the invention. The computing device 600 may include a number of components. In one embodiment, these components are attached to one or more motherboards. In an alternate embodiment, these components are fabricated onto a single system-on-a-chip (SoC) die rather than a motherboard. The components in the computing device 600 include, but are not limited to, an integrated circuit die 602 and at least one communication chip 608. In some implementations the communication chip 608 is fabricated as part of the integrated circuit die 602. The integrated circuit die 602 may include a CPU 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), a graphics processing unit 614 (GPU), a digital signal processor 616, a crypto processor 642 (a specialized processor that executes cryptographic algorithms within hardware), a chipset 620, an antenna 622, a display or a touchscreen display 624, a touchscreen controller 626, a battery 628 or other power source, a power amplifier (not shown), a global positioning system (GPS) device 644, a compass 630, a motion coprocessor or sensors 632 (that may include an accelerometer, a gyroscope, and a compass), a speaker 634, a camera 636, user input devices 638 (such as a keyboard, mouse, stylus, and touchpad), and a mass storage device 640 (such as hard disk drive, compact disk (CD), digital versatile disk (DVD), and so forth).

The communications chip 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 608. For instance, a first communication chip 608 may be dedicated to shorter range wireless communications such as Wi-Fi and Bluetooth and a second communication chip 608 may be dedicated to longer range wireless communications such as GPS, EDGE, GPRS, CDMA, WiMAX, LTE, Ev-DO, and others.

The processor 604 of the computing device 600 includes one or more devices, such as non-planar a-IGZO transistors, according to an embodiment of the invention. The term "processor" may refer to any device or portion of a device that processes electronic data from registers and/or memory to transform that electronic data into other electronic data that may be stored in registers and/or memory.

The communication chip 608 may also include one or more devices, such as one or more non-planar a-IGZO transistors, according to an embodiment of the invention.

In further embodiments, another component housed within the computing device 600 may contain one or more devices, such as non-planar a-IGZO transistors, or processes for forming such devices, according to an embodiment of the invention.

In various embodiments, the computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a semiconductor device, comprising: a substrate; a source region formed above the substrate; a drain region formed above the substrate; an InGaZnO (IGZO) layer formed above the substrate and electrically coupled to the source region and the drain region; and a gate electrode separated from the IGZO layer by a gate dielectric, wherein the gate dielectric contacts more than one surface of the IGZO layer.

Additional embodiments of the invention include a semiconductor device, wherein the IGZO layer has sidewall surfaces that contact sidewalls of the source region and the drain region and a planar surface that is substantially parallel to the substrate.

Additional embodiments of the invention include a semiconductor device, wherein the gate dielectric contacts the sidewall surfaces and the planar surface.

Additional embodiments of the invention include a semiconductor device, wherein the IGZO layer is a fin formed over the substrate.

Additional embodiments of the invention include a semiconductor device, wherein the gate dielectric contacts sidewalls of the IGZO fin and a top surface of the IGZO fin.

Additional embodiments of the invention include a semiconductor device, wherein the source region and the drain region contact a top surface of the IGZO fin.

Additional embodiments of the invention include a semiconductor device, wherein the IGZO layer is a nanowire or a nanoribbon.

Additional embodiments of the invention include a semiconductor device, wherein the gate dielectric wraps around the entire surface of the nanowire or nanoribbon.

Additional embodiments of the invention include a semiconductor device, wherein sidewall spacers separate the source region and the drain region from the gate electrode.

Additional embodiments of the invention include a semiconductor device, wherein the gate electrode includes a workfunction metal and a fill metal.

Additional embodiments of the invention include a semiconductor device, wherein the substrate is a dielectric layer.

Additional embodiments of the invention include a semiconductor device, wherein the dielectric layer is a layer in a back end of line (BEOL) stack of an integrated circuit chip.

Embodiments of the invention include a method of forming a non-planar InGaZnO (IGZO) transistor, comprising: forming a dielectric layer over a substrate; patterning the dielectric layer to form a source opening and a drain opening; forming a conductive source region in the source opening and a conductive drain region in the drain opening; removing the portion of the dielectric layer between the source region and the drain region; forming an IGZO layer over the substrate between the source region and the drain region, wherein the IGZO layer includes sidewall portions that contact a sidewall of the source region and a sidewall of the drain region and a planar portion that is substantially parallel to the substrate; forming a gate dielectric layer over the IGZO layer; and forming a gate electrode over the gate dielectric layer.

Additional embodiments of the invention include a method of forming a non-planar IGZO, further comprising: planarizing the gate electrode so that a top surface of the gate electrode is substantially coplanar with a top surface of the source region and the drain region.

Additional embodiments of the invention include a method of forming a non-planar IGZO, wherein the source region and the drain region are separated from the gate electrode by the IGZO layer and the gate dielectric layer.

Additional embodiments of the invention include a method of forming a non-planar IGZO, wherein the substrate is a dielectric layer in a back end of line (BEOL) stack of an integrated circuit chip.

Additional embodiments of the invention include a method of forming a non-planar IGZO, wherein a maximum processing temperature does not exceed approximately 400° C.

Embodiments of the invention include a method of forming a non-planar InGaZnO (IGZO) transistor, comprising: forming a first layer over a substrate, wherein the first layer includes IGZO; patterning the first layer to form a fin; forming a dummy gate electrode over the fin; forming a source region and a drain region on a top surface of the fin, wherein the source region and the drain region are on opposite sides of the dummy gate electrode; removing the dummy gate electrode; forming a gate dielectric layer on exposed portions of the IGZO; and forming a gate electrode over the gate dielectric layer.

Additional embodiments of the invention include a method of forming a non-planar IGZO, wherein the first layer includes a plurality of sacrificial material layers in an alternating pattern with a plurality of IGZO layers.

Additional embodiments of the invention include a method of forming a non-planar IGZO, further comprising: removing a portion of the sacrificial material layers that is formed between the source region and the drain region prior to forming the gate dielectric layer.

Additional embodiments of the invention include a method of forming a non-planar IGZO, wherein forming the gate dielectric layer on exposed portions of the IGZO includes forming a gate dielectric layer around all surfaces of the IGZO between the source region and the drain region.

Additional embodiments of the invention include a method of forming a non-planar IGZO, further comprising: forming sidewall spacers along sidewalls of the dummy gate electrode.

Additional embodiments of the invention include a method of forming a non-planar IGZO, wherein the gate electrode is separated from the source region and the drain region by the sidewall spacers.

Additional embodiments of the invention include a method of forming a non-planar IGZO, wherein the substrate is a dielectric layer in a back end of line (BEOL) stack of an integrated circuit chip.

Additional embodiments of the invention include a method of forming a non-planar IGZO, wherein a maximum processing temperature does not exceed approximately 400° C.

What is claimed is:

1. A semiconductor device, comprising:
   a substrate;
   a source region above the substrate;
   a drain region above the substrate;
   an InGaZnO (IGZO) fin above the substrate and electrically coupled to the source region and the drain region; and
   a gate electrode separated from the IGZO fin by a gate dielectric, wherein the gate dielectric has a bottommost surface above a bottommost surface of the IGZO fin, and wherein the gate electrode has an uppermost surface at a same level as an uppermost surface of the source and drain regions.

2. The semiconductor device of claim 1, wherein the source region and the drain region contact a top surface of the IGZO fin.

3. The semiconductor device of claim 1, wherein the gate electrode includes a workfunction metal and a fill metal.

4. The semiconductor device of claim 1, wherein the substrate is a dielectric layer.

5. The semiconductor device of claim 4, wherein the dielectric layer is a layer in a back end of line (BEOL) stack of an integrated circuit chip.

6. A semiconductor device, comprising:
   a substrate;
   a source region above the substrate;
   a drain region above the substrate;
   an InGaZnO (IGZO) nanowire or nanoribbon above the substrate and electrically coupled to the source region and the drain region; and
   a gate electrode separated from the IGZO nanowire or nanoribbon by a gate dielectric, wherein the gate electrode has an uppermost surface co-planar with an uppermost surface of the gate dielectric, wherein the uppermost surface of the gate electrode is at a same level as an uppermost surface of the source and drain regions.

7. The semiconductor device of claim 6, wherein the gate dielectric wraps around the entire surface of the nanowire or nanoribbon.

8. The semiconductor device of claim 7, wherein sidewall spacers separate the source region and the drain region from the gate electrode.

9. The semiconductor device of claim 6, wherein the gate electrode includes a workfunction metal and a fill metal.

10. The semiconductor device of claim 6, wherein the substrate is a dielectric layer.

11. The semiconductor device of claim 10, wherein the dielectric layer is a layer in a back end of line (BEOL) stack of an integrated circuit chip.

* * * * *